US010819083B2

(12) United States Patent
Onishi et al.

(10) Patent No.: US 10,819,083 B2
(45) Date of Patent: Oct. 27, 2020

(54) VERTICAL CAVITY SURFACE-EMITTING LASER

(71) Applicant: SUMITOMO ELECTRIC INDUSTRIES, LTD., Osaka (JP)

(72) Inventors: Yutaka Onishi, Osaka (JP); Hiroyuki Yoshinaga, Osaka (JP); Rei Tanaka, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 16/426,608

(22) Filed: May 30, 2019

(65) Prior Publication Data

US 2019/0372301 A1 Dec. 5, 2019

(30) Foreign Application Priority Data

May 31, 2018 (JP) ................................ 2018-104876

(51) Int. Cl.
*H01S 5/183* (2006.01)
*H01S 5/02* (2006.01)
(Continued)

(52) U.S. Cl.
CPC ............ *H01S 5/0206* (2013.01); *H01S 5/026* (2013.01); *H01S 5/183* (2013.01); *H01S 5/1835* (2013.01);
(Continued)

(58) Field of Classification Search
CPC ............. H01S 5/18338; H01S 5/18311; H01S 5/18313; H01S 5/1835
See application file for complete search history.

(56) References Cited

U.S. PATENT DOCUMENTS

| | | | |
|---|---|---|---|
| 6,700,914 B2 | 3/2004 | Yokouchi et al. |
| 2004/0217381 A1 | 11/2004 | Wang et al. |
| 2011/0115872 A1 | 5/2011 | Haraska et al. |

FOREIGN PATENT DOCUMENTS

EP 2131459 A2 12/2009

OTHER PUBLICATIONS

Verschaffelt, "Polarization Stabilization in Vertical-Cavity Surface-Emitting Lasers Through Asymmetric Current Injection," Aug. 2000, IEEE Photonics Technology Letters, vol. 12, No. 8pp. 945-947. (Year: 2000).*

(Continued)

*Primary Examiner* — Michael Carter
(74) *Attorney, Agent, or Firm* — Smith, Gambrell & Russell, LLP.

(57) ABSTRACT

A vertical cavity surface-emitting laser including: a substrate having a main surface; and a post structure mounted on the main surface. The post structure includes an active layer and a carrier confinement structure. The carrier confinement structure includes a first region and a second region having a higher resistivity than the first region. The first region has an edge, and a first to a third reference line segments. A first length of the first reference line segment is longest among lengths of line segments joining any two points on the edge and extending in a direction of the III-V group semiconductor. The first length is greater than a sum of a second length of the second reference line segment and a third length of the third reference line segment. The third length is smaller than the second length and is zero or more.

22 Claims, 17 Drawing Sheets

(51) Int. Cl.
*H01S 5/026* (2006.01)
*H01S 5/22* (2006.01)

(52) U.S. Cl.
CPC ............ *H01S 5/18338* (2013.01); *H01S 5/22* (2013.01); *H01S 5/18311* (2013.01); *H01S 5/18313* (2013.01)

(56) References Cited

OTHER PUBLICATIONS

Verschaffelt, G. et al,,"Polarization Stabilization in Vertical-Cavity Surface-Emitting Lasers Through Asymmetric Current Injection", *IEEE Photonics Technology Letters*, vol. 12, No. 8, pp. 945-947, Aug. 1, 2000.

* cited by examiner

VERTICAL CAVITY SURFACE-EMITTING LASER

BACKGROUND OF THE INVENTION

1. Field of the Invention

The present invention relates to vertical cavity surface-emitting lasers.

2. Description of the Related Art

U.S. Pat. No. 6,700,914 discloses a surface-emitting laser.

In a vertical cavity surface-emitting laser, carriers flow through a post structure to reach an active layer. The post structure has a confinement structure that confines carriers to the active layer. The active layer emits light in response to the injection of carriers. The emission of light from the active layer results in laser oscillation through a vertical cavity structure. The confinement structure allows carriers to be supplied to the desired area of the active layer.

The post structure allows not only carriers, but also laser light to propagate therethrough. Laser light propagating through the post structure contains a fundamental mode component and higher-order mode components. These mode components oscillate at their respective wavelengths. The presence of mode components at adjacent wavelengths increases noise (relative intensity noise) in laser light.

SUMMARY OF THE INVENTION

One aspect of the present invention is to provide a vertical cavity surface-emitting laser with reduced relative intensity noise.

A vertical cavity surface-emitting laser according to one aspect of the present invention includes a substrate having a main surface including a III-V group compound semiconductor and a post structure including an active layer and a carrier confinement structure that are arranged in a direction along a first axis crossing the main surface of the substrate. The post structure is mounted on the substrate. The carrier confinement structure includes a first region and a second region. The first region has a lower resistivity than the second region. The first region and the second region are arranged in a first reference plane crossing the direction along the first axis. The first region has an edge, a first length, a second length, and a third length. The edge has a first portion and a second portion. The first length is a length of a first reference line segment, the first reference line segment joining a first point and a second point on the edge, the first reference line segment being longest one of a first set of line segments joining any two points on the edge and extending in a [1-10] direction of the III-V group compound semiconductor. The second length is a length of a second reference line segment, the second reference line segment joining a point on the first portion of the edge and a point on the first reference line segment, the second reference line segment making a right angle with the first reference line segment. The third length is a length of a third reference line segment, the third reference line segment joining a point on the second portion of the edge and a point on the first reference line segment, the third reference line segment making a right angle with the first reference line segment. The first length is greater than the sum of the second length and the third length. The third length is smaller than the second length and is zero or more.

DESCRIPTION OF THE PREFERRED EMBODIMENTS

Figure 1:
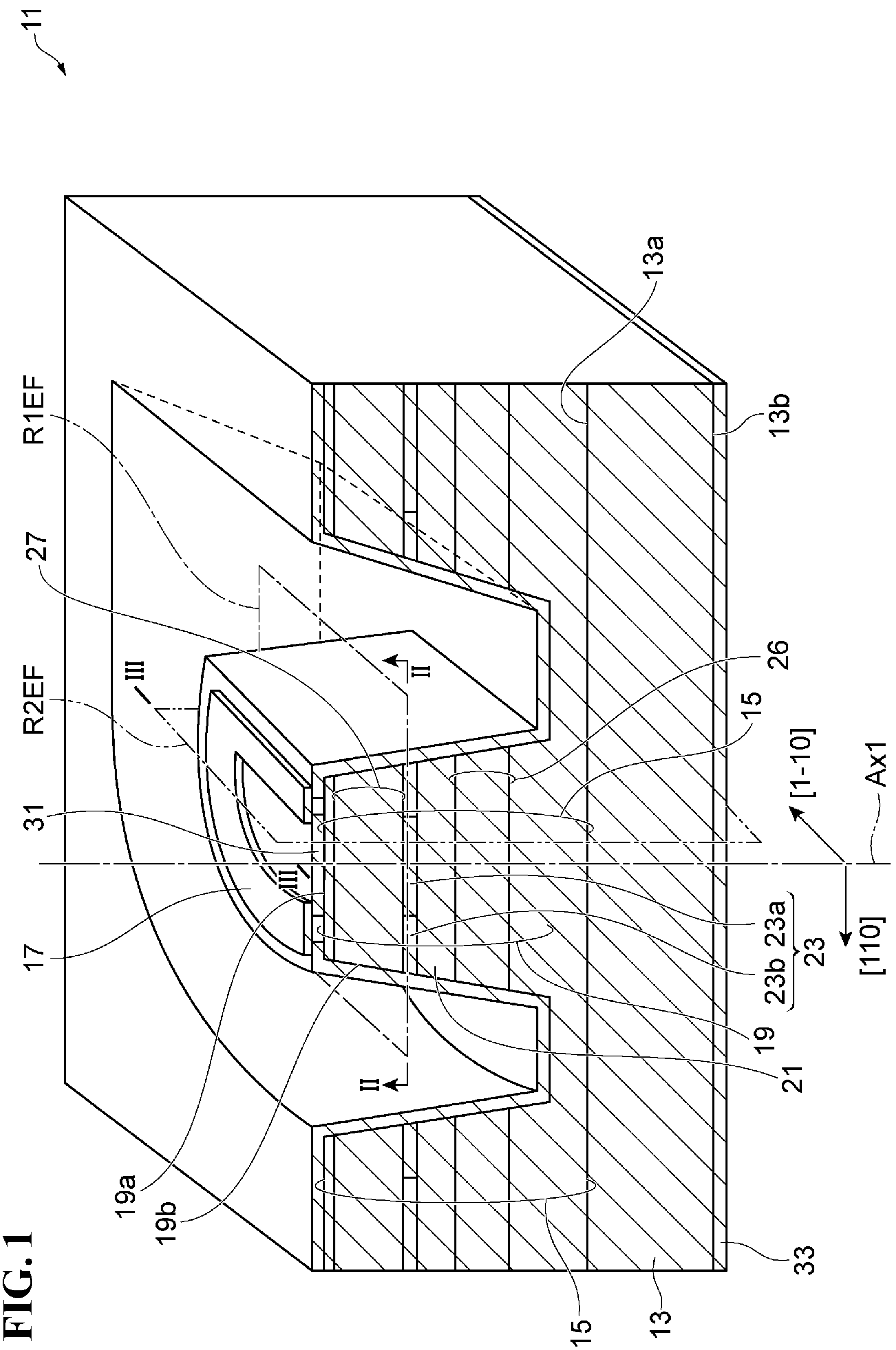
FIG. 1 is a schematic perspective view of a vertical cavity surface-emitting laser according to one embodiment.

Some specific examples will now be described.

A specific example of a vertical cavity surface-emitting laser includes (a) a substrate having a main surface including a III-V group compound semiconductor and (b) a semiconductor structure having a post structure including an active layer and a carrier confinement structure that are arranged in a direction along a first axis crossing the main surface of the substrate. The post structure is mounted on the substrate. The carrier confinement structure includes a first region and a second region. The first region has a lower resistivity than the second region. The first region and the second region are arranged in a first reference plane crossing the direction along the first axis. The first region has an edge, a first length, a second length, and a third length. The edge has a first portion and a second portion. The first length is a length of a first reference line segment, the first reference line segment joining a first point and a second point on the edge, the first reference line segment being longest one of a first set of line segments joining any two points on the edge and extending in a [1-10] direction of the III-V group compound semiconductor. The second length is a length of a second reference line segment, the second reference line segment joining a point on the first portion of the edge and a point on the first reference line segment, the second reference line segment making a right angle with the first reference line segment. The third length is a length of a third reference line segment, the third reference line segment joining a point on the second portion of the edge and a point on the first reference line segment, the third reference line segment making a right angle with the first reference line segment. The first length is greater than the sum of the second length and the third length. The third length is smaller than the second length and is zero or more.

In the vertical cavity surface-emitting laser, carriers flow through the post structure in the direction along the first axis and are supplied to the active layer, and the propagation of light in the direction along the first axis results in laser oscillation. This laser light contains a fundamental mode component and higher-order mode components.

These mode components have their respective intensity distributions in a plane crossing the first axis. According to the findings of the inventors, a spatial overlap between the intensity distributions of the mode components decreases the stability of laser oscillation and increases relative intensity noise. A reduction in this overlap is associated with the cross-sectional shape of the carrier confinement structure, rather than the cross-sectional shape of the post structure. In the above vertical cavity surface-emitting laser, the cross-section of the carrier confinement structure has a certain geometric shape that reduces the spatial overlap between the intensity distributions of the mode components of the laser light and increases the stability of laser oscillation. Thus, relative intensity noise can be reduced.

The second length of the second reference line segment is greater than zero. The third length of the third reference line segment is smaller than the second length of the second reference line segment and is zero or more. The first length of the first reference line segment is greater than the sum of the second length of the second reference line segment and the third length of the third reference line segment. A first width which is defined as the length of a line segment parallel to the first reference line segment at the first portion of the edge of the cross-section changes monotonically from the first length to a length smaller than the first length, for example, zero, in the direction from the fourth point toward the third point.

Since the third length of the third line segment is smaller than the second length of the second reference line segment, the shape defined by the first portion of the edge of the cross-section and the first reference line segment is not congruent with the shape defined by the second portion of the edge of the cross-section and the first reference line segment. This non-congruence makes it easy to make a difference between the intensity distribution of light in the region defined by the first portion of the edge and the first reference line segment and the intensity distribution of light in the region defined by the second portion and the first reference line segment. This difference in distribution allows for a reduction in spatial overlap between the intensity distributions of the mode components.

In a specific example of a vertical cavity surface-emitting laser, the first region of the carrier confinement structure is formed of a III-V group compound semiconductor containing aluminum as a III group constituent element, and the second region of the carrier confinement structure is formed of an oxide of the III group constituent element of the III-V group compound semiconductor.

In the vertical cavity surface-emitting laser, the cross-sectional shape of the first region of the carrier confinement structure defines the flow of carriers into the active layer. The shapes of the first and second regions are determined by the oxidation of the III-V group compound semiconductor containing aluminum as a III group constituent element.

In a specific example of a vertical cavity surface-emitting laser, the semiconductor structure includes an upper distributed Bragg reflector structure and a lower distributed Bragg reflector structure. The active layer and the carrier confinement structure are disposed between the upper distributed Bragg reflector structure and the lower distributed Bragg reflector structure. The upper distributed Bragg reflector structure is located within the post structure.

In the vertical cavity surface-emitting laser, the upper distributed Bragg reflector structure and the lower distributed Bragg reflector structure form a resonator.

In a specific example of a vertical cavity surface-emitting laser, the second reference line segment and the third reference line segment lie on a single straight line.

In the vertical cavity surface-emitting laser, the line segment having the greatest length of the second set of line segments connects to the line segment having the greatest length of the third set of line segments so that a single line segment can be defined.

In a specific example of a vertical cavity surface-emitting laser, the second reference line segment extends to the midpoint of the first reference line segment.

In the vertical cavity surface-emitting laser, the second reference line segment may divide the first reference line segment into two equal parts so that the geometric shape of the first portion of the edge of the cross-section is symmetric with respect to the second reference line segment.

In a specific example of a vertical cavity surface-emitting laser, the single straight line coincides with a single axis of symmetry of the first region of the carrier confinement structure.

In the vertical cavity surface-emitting laser, the third reference line segment may divide the first reference line segment into two equal parts so that the geometric shape of the second portion of the edge of the cross-section is symmetric with respect to the third reference line segment.

In a specific example of a vertical cavity surface-emitting laser, the first length of the first reference line segment is greater than 1.1 times the sum of the second length of the second reference line segment and the third length of the third reference line segment.

In the vertical cavity surface-emitting laser, a cross-section having a first length greater than 1.1 times the sum of the second length and the third length makes a clear difference between the shape defined by the first portion of the edge of the cross-section and the shape defined by the second portion of the edge of the cross-section.

In a specific example of a vertical cavity surface-emitting laser, the edge of the first region of the carrier confinement structure has a shape of an isosceles triangle with a rounded vertex angle and acute base angles.

In a specific example of a vertical cavity surface-emitting laser, the post structure has an edge, and the edge of the post structure has a first portion projecting in a [110] axis direction of the III-V group compound semiconductor and a second portion extending in the [110] axis direction of the III-V group compound semiconductor.

In a specific example of a vertical cavity surface-emitting laser, the edge of the first region of the carrier confinement structure has a shape of a rectangle and an isosceles triangle sharing a base with the rectangle, the isosceles triangle having a rounded vertex angle.

In a specific example of a vertical cavity surface-emitting laser, the post structure has an edge, and the edge of the post structure has a first portion projecting in a [110] axis direction of the III-V group compound semiconductor and a second portion extending in the [110] axis direction of the III-V group compound semiconductor.

In a specific example of a vertical cavity surface-emitting laser, the edge of the first region of the carrier confinement structure has a shape of an isosceles trapezoid and an isosceles triangle sharing a base with the isosceles trapezoid, the isosceles triangle having a rounded vertex angle.

In a specific example of a vertical cavity surface-emitting laser, the post structure has an edge, and the edge of the post structure has a first portion projecting in a [110] axis direction of the III-V group compound semiconductor and a second portion projecting in the [110] axis direction of the III-V group compound semiconductor.

In a specific example of a vertical cavity surface-emitting laser, the edge of the first region of the carrier confinement structure has a shape of an isosceles trapezoid and an isosceles triangle sharing a base with the isosceles trapezoid, the isosceles triangle has a rounded vertex angle, and the isosceles trapezoid has rounded obtuse angles.

In a specific example of a vertical cavity surface-emitting laser, the post structure has an edge, the edge of the post structure has a first portion projecting in a [110] axis direction of the III-V group compound semiconductor and a second portion projecting in the [110] axis direction of the III-V group compound semiconductor, and the second portion of the edge of the post structure has a sector shape.

In a specific example of a vertical cavity surface-emitting laser, the edge of the first region of the carrier confinement structure has a shape of a convex curve and a line segment connecting endpoints of the convex curve.

In a specific example of a vertical cavity surface-emitting laser, the edge of the first region of the carrier confinement structure has a shape of a convex curve and a rectangle adjoining with the convex curve.

The findings of the present invention can be easily understood from the following detailed description with reference to the accompanying drawings, which are given by way of example. Next, a vertical cavity surface-emitting laser according to one embodiment will now be described with reference to the accompanying drawings. Where possible, like parts are denoted by like reference numerals.

Figure 2:
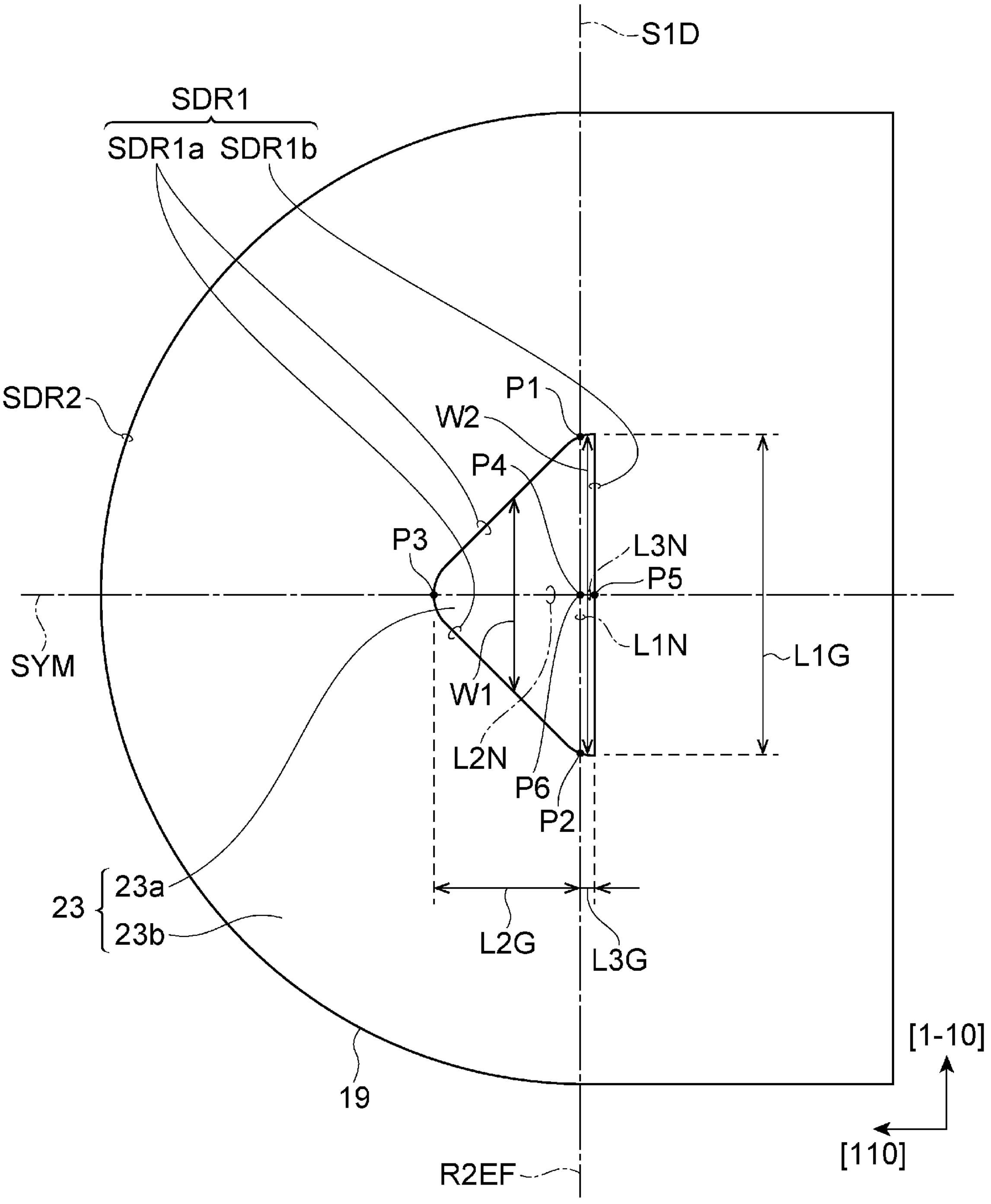
FIG. 2 is a sectional view taken along line II-II in FIG. 1, showing the carrier confinement structure of the vertical cavity surface-emitting laser according to the embodiment.
Figure 3:
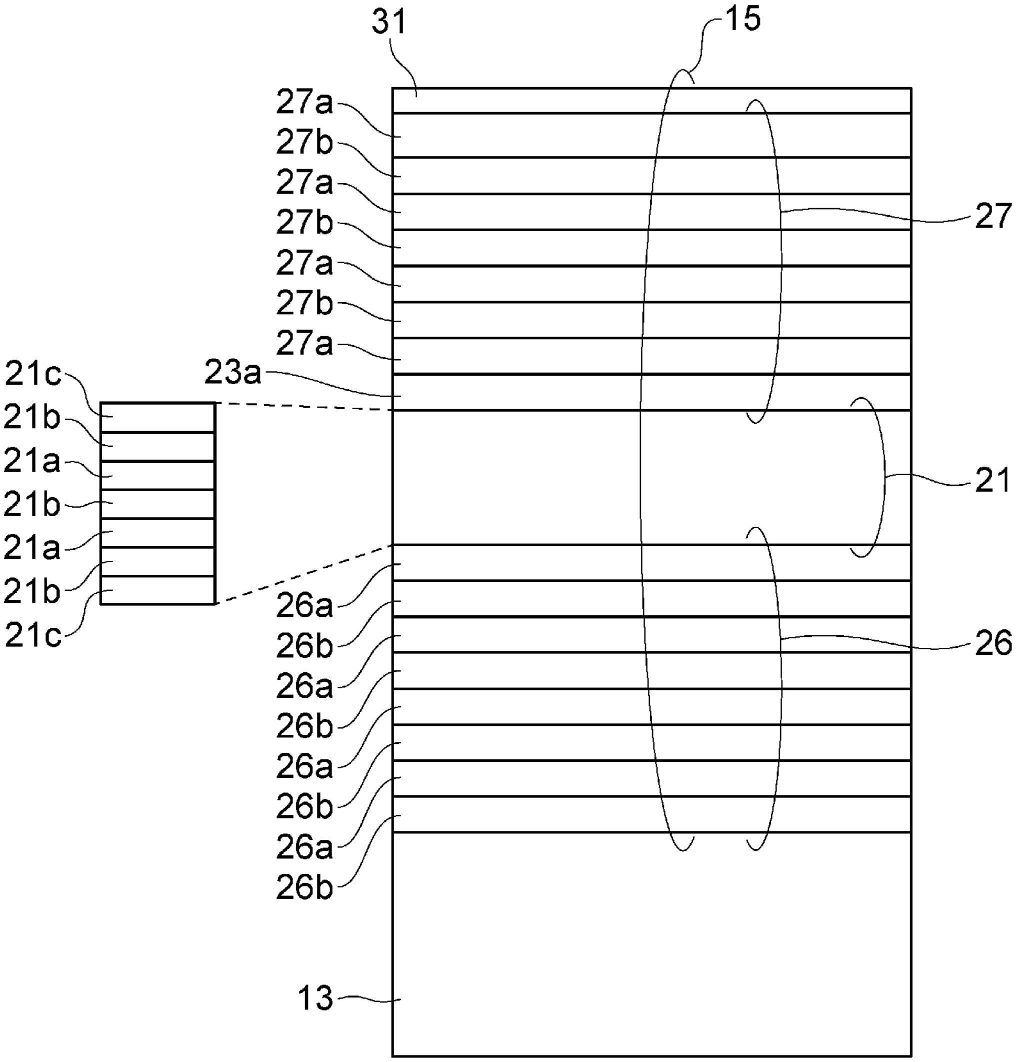
FIG. 3 is a sectional view taken along line in FIG. 1, showing the epitaxial structure of the vertical cavity surface-emitting laser according to the embodiment.

FIG. 1 is a schematic perspective view of the vertical cavity surface-emitting laser according to the embodiment. FIG. 2 is a sectional view taken along line II-II in FIG. 1, showing the carrier confinement structure of the vertical cavity surface-emitting laser according to the embodiment. FIG. 3 is a sectional view taken along line in FIG. 1, showing the epitaxial structure of the vertical cavity surface-emitting laser according to the embodiment.

A vertical cavity surface-emitting laser 11 includes a substrate 13 and a semiconductor structure 15. The semiconductor structure 15 has a post structure 19. The post structure 19 has a top surface 19*a* and a side surface 19*b*. The semiconductor structure 15 includes the post structure 19 which includes an active layer 21 and a carrier confinement structure 23. The active layer 21 and the carrier confinement structure 23 are arranged in a direction along a first axis Ax1. The first axis AX1 crosses a main surface 13*a* of the substrate 13. The semiconductor structure 15 is mounted on the main surface 13*a* of the substrate 13.

The carrier confinement structure 23 includes a current aperture region (a first region) 23*a* with low resistivity and a current blocking region (a second region) 23*b* with high resistivity. The current aperture region 23*a* and the current blocking region 23*b* are arranged in a first reference plane R1EF crossing the first axis Ax1. The current blocking region 23*b* surrounds the current aperture region 23*a*.

Referring to FIG. 2, two solid lines are shown, one indicating an edge SDR1 of the current aperture region 23*a* and the other indicating an edge SDR2 of the current blocking region 23*b*. The edge SDR2 is the contours of the post structure 19. The first reference plane R1EF crosses a second reference plane R2EF. The second reference plane R2EF extends in the direction along the first axis Ax1 at a first reference line segment L1N. The first reference line segment L1N joins a first point P1 and a second point P2 on the edge SDR1. The edge SDR1 is an edge of the cross-section defined by the crossing of the first reference plane R1EF and the current aperture region 23*a* (the cross-section shown in FIG. 2). This cross-section of the current aperture region 23*a* has a projecting shape. As shown in FIG. 2, the first reference line segment L1N extends in the [1-10] direction, which includes crystallographically equivalent directions, of a III-V group compound semiconductor. The first reference line segment L1N is one of a first set of line segments. The first set of line segments consists of all possible line segments, which join any two points on the edge SDR1 and extend parallel in the [1-10] direction. In other words, the first set of line segments is a group of line segments each of which joins a pair of points on the edge SDR1. The first reference line segment L1N is not shorter than any other line segment of the first set of line segments (i.e., is longer than or equal to any other line segment).

The edge SDR1 has a first portion SDR1*a* and a second portion SDR1*b* that are delimited by the first point P1 and the second point P2.

The first reference line segment L1N makes a right angle with a second reference line segment L2N. The second reference line segment L2N joins a third point P3 on the first portion SDR1*a* of the edge SDR1 to a fourth point P4 on the first reference line segment L1N. The second reference line segment L2N is one of a second set of line segments. The second set of line segments consists of all possible line segments, which vertically cross with the first reference line segment L1N and join points on the first portion SDR1*a* and points on the first reference line segment L1N. In other words, the second set of line segments is a group of line segments each of which joins a point on the first portion SDR1*a* and a point on the first reference line segment L1N. The second reference line segment L2N is not shorter than any other line segment of the second set of line segments (i.e., is longer than or equal to any other line segment).

The first reference line segment L1N makes a right angle with a third reference line segment L3N. The third reference line segment L3N joins a fifth point P5 on the second portion SDR1*b* of the edge SDR1 to a sixth point P6 on the first reference line segment L1N. The third reference line segment L3N is one of a third set of line segments. The third set of line segments consists of all possible line segments, which vertically cross with the first reference line segment L1N and join points on the second portion SDR1*b* and points on the first reference line segment L1N. In other words, the third set of line segments is a group of line segments each of which joins a point on the second portion SDR1*b* and a point on the first reference line segment L1N. The third reference line segment L3N is not shorter than any other line segment of the third set of line segments (i.e., is longer than or equal to any other line segment).

The first reference line segment L1N, the second reference line segment L2N, and the third reference line segment L3N have a first length L1G, a second length L2G, and a third length L3G, respectively.

The first length L1G of the first reference line segment L1N is greater than the sum of the second length L2G of the second reference line segment L2N and the third length L3G of the third reference line segment L3N (L1G>L2G+L3G; L1G>L2G; and L1G>L3G). The third length L3G of the third reference line segment L3N is smaller than the second length L2G of the second reference line segment L2N and is zero or more (0 L3G<L2G).

The first reference line segment L1N is positioned to give the second length L2G the minimum possible value. In this arrangement, the second length L2G is greater than the third length L3G. Alternatively, the first reference line segment L1N is positioned to give the third length L3G the maximum possible value. In this arrangement, the second length L2G is greater than the third length L3G.

In the vertical cavity surface-emitting laser 11, carriers flow through the post structure 19 in the direction along the first axis Ax1 and are supplied to the active layer 21. The carriers in the active layer 21 generate light, and the light propagates through the post structure 19. The propagation of light in the direction along the first axis Ax1 results in laser oscillation. This laser light contains a fundamental mode component and higher-order mode components. These mode components have their respective intensity distributions in a plane crossing the first axis Ax1. According to the findings of the inventors, a spatial overlap between the intensity distributions of the mode components degrades the stability of laser oscillation, and a reduction of the spatial overlap is preferable for a stable laser oscillation. The reduction in this overlap is associated with the cross-sectional shape of the carrier confinement structure 23, rather than the cross-sectional shape of the post structure 19.

The second length L2G of the second reference line segment L2N is greater than zero. The third length L3G of the third reference line segment L3N is smaller than the second length L2G of the second reference line segment L2N and is zero or more. The first length L1G of the first reference line segment L1N is greater than the sum of the second length L2G and the third length L3G. A first width W1 is defined as the length of a line segment parallel to the first reference line segment L1N by the first portion SDR1*a* of the edge SDR1. A second width W2 is defined as the length of a line segment parallel to the first reference line segment L1N by the second portion SDR1*b* of the edge SDR1. The first width W1 changes monotonically from the first length L1G to a value smaller than the first length L1G, for example, zero, in the direction from the fourth point P4 toward the third point P3.

Since the third length L3G is smaller than the second length L2G, the shape defined by the first portion SDR1*a* of the edge SDR1 and the first reference line segment L1N is not congruent with the shape defined by the second portion SDR1*b* of the edge SDR1 and the first reference line segment L1N. This non-congruence results in a difference between the intensity distributions of the mode components in the region defined by the first portion SDR1*a* and the first reference line segment L1N and the intensity distributions of the mode components in the region defined by the second portion SDR1*b* and the first reference line segment L1N. This difference in distribution allows for a reduction in spatial overlap between the intensity distributions of the mode components.

When a third reference line segment L3N has a third length L3G of zero or more, the second portion SDR1*b* of the edge SDR1 may extend along the first reference line segment L1N. The first width W1 changes monotonically from the first length L1G to a value smaller than the first length L1G, for example, zero, in the direction from the fourth point P4 toward the third point P3. This limitation makes it easy for the cross-section of the current aperture region 23*a* of the carrier confinement structure 23 to have a projecting shape. Giving a projecting shape to the cross-section of the current aperture region 23*a* also makes it possible to avoid excessive complexity in the intensity distribution patterns of the mode components.

When a third reference line segment L3N has a third length L3G greater than zero, the second width W2 changes monotonically from the first length L1G to a value smaller than the first length L1G, for example, zero, in the direction from the sixth point P6 toward the fifth point P5. In addition, the first width W1 changes monotonically from the first length L1G to a value smaller than the first length L1G, for example, zero, in the direction from the fourth point P4 toward the third point P3. These limitations make it easy for the cross-section of the current aperture region 23*a* of the carrier confinement structure 23 to have a projecting shape.

The first length L1G of the first reference line segment L1N is preferably greater than 1.1 times the sum of the second length L2G of the second reference line segment L2N and the third length L3G of the third reference line segment L3N. In the vertical cavity surface-emitting laser 11, a first length L1G greater than 1.1 times the sum of the second length L2G and the third length L3G makes a clear difference between the shape defined by the first portion SDR1*a* of the edge SDR1 and the shape defined by the second portion SDR1*b* of the edge SDR1.

Referring further to FIG. 1, the substrate 13 has the main surface 13*a* and a back surface 13*b*. The back surface 13*b* is opposite to the main surface 13*a*. The main surface 13*a* includes a III-V group compound semiconductor. In this example, the back surface 13*b* includes the III-V group compound semiconductor. This III-V group compound semiconductor has a zinc-blende-type crystal structure. The substrate 13 includes, for example, a conductive III-V group compound semiconductor support.

The vertical cavity surface-emitting laser 11 includes an electrode 17 and another electrode 33. The electrode 17 is disposed on the top surface 19*a* of the post structure 19. In this example, the electrode 33 is disposed on the back surface 13*b*. The electrode 17 is one of an anode and a cathode, whereas the electrode 33 is the other of the anode and the cathode.

Specifically, the edge SDR1 shown in FIG. 2 has a shape similar to an isosceles triangle. The vertex angle and two base angles of the isosceles triangle are rounded. The planar shape defined by the edge SDR1, has a single axis of symmetry SYM (an axis orthogonal to the first reference line segment L1N). The second reference line segment L2N and the third reference line segment L3N lie on a single straight line extending along the axis of symmetry SYM. The rounded base angles allow the third length L3G of the third reference line segment L3N to be greater than zero and smaller than the second length L2G of the second reference line segment L2N. The first reference line segment L1N extends in the [1-10] direction of the III-V group compound semiconductor, whereas the second reference line segment L2N and the third reference line segment L3N extend in the [110] direction.

The post structure 19 has the edge SDR2. The edge SDR2 includes a line segment extending in the direction along the [1-10] axis and a convex curve defining a shape projecting in the direction along the [110] axis. The line segment of the edge SDR2 connects to both ends of the convex curve of the edge SDR2, thereby defining a closed shape. Where necessary, the edge SDR2 may further include a pair of line segments extending in the direction along the [110] axis. The above line segment of the edge SDR2 may connect to both ends of the convex curve of the edge SDR2 via the pair of line segments. The edge SRD2 shares the axis of symmetry SYM with the edge SRD1 of the current aperture region 23*a*. The edge SDR2 provides the above-mentioned shape of the edge SDR1.

A second reference line segment L2N that divides the first length L1G into two equal parts makes it easy for the geometric shape of the first portion SDR1*a* of the edge SDR1 to have an axis of symmetry.

A third reference line segment L3N that divides the first length L1G into two equal parts makes it easy for the geometric shape of the second portion SDR1*b* of the edge SDR1 to have an axis of symmetry.

The second reference line segment L2N and the third reference line segment L3N may lie on a single straight line. In this vertical cavity surface-emitting laser 11, the line segment having the greatest length of the second set of line segments connects to the line segment having the greatest length of the third set of line segments so that a single line segment can be defined.

As shown in FIGS. 1 and 3, the semiconductor structure 15 further includes a lower distributed Bragg reflector structure 26 and an upper distributed Bragg reflector structure 27, with the active layer 21 disposed between the lower distributed Bragg reflector structure 26 and the upper distributed Bragg reflector structure 27. The lower distributed Bragg reflector structure 26 has a superlattice including alternately arranged first layers 26*a* and second layers 26*b*, whereas the upper distributed Bragg reflector structure 27 has a superlattice including alternately arranged first layers 27*a* and second layers 27*b*. In this example, a portion of the lower distributed Bragg reflector structure 26 and the upper distributed Bragg reflector structure 27 may be located within the post structure 19, with the rest of the lower distributed Bragg reflector structure 26 located outside the post structure 19. In the vertical cavity surface-emitting laser 11, the lower distributed Bragg reflector structure 26 and the upper distributed Bragg reflector structure 27 form a resonator.

The current aperture region 23*a* of the carrier confinement structure 23 is formed of a III-V group compound semiconductor containing aluminum as a III group constituent element. The current blocking region 23*b* of the carrier confinement structure 23 is formed of an oxide of the III group constituent element of the III-V group compound semiconductor. The cross-sectional shape of the current aperture region 23*a* of the carrier confinement structure 23 defines the flow of carriers into the active layer 21.

An example of the semiconductor layer structure shown in FIG. 3 is shown below:

Substrate 13: n-type GaAs, (001) plane (including crystallographically equivalent planes)

Lower distributed Bragg reflector structure 26: n-type AlGaAs (26*a*)/AlGaAs (26*b*) superlattice Active layer 21 (quantum well structure)

Well layers 21*a*: GaAs

Barrier layers 21*b*: AlGaAs

Spacer layers 21*c*: AlGaAs

An example of the carrier confinement structure 23 is shown below:

Current aperture region 23*a*: AlAs or $AlxGa_{1-x}As$ (where X is 0.95 or more), a thickness of 10 to 50 nm Current blocking region 23*b*: containing aluminum oxide Upper distributed Bragg reflector structure 27: p-type AlGaAs (27*a*)/AlGaAs (27*b*) superlattice Contact layer 31: p-type GaAs

EXAMPLES

Figure 4A:
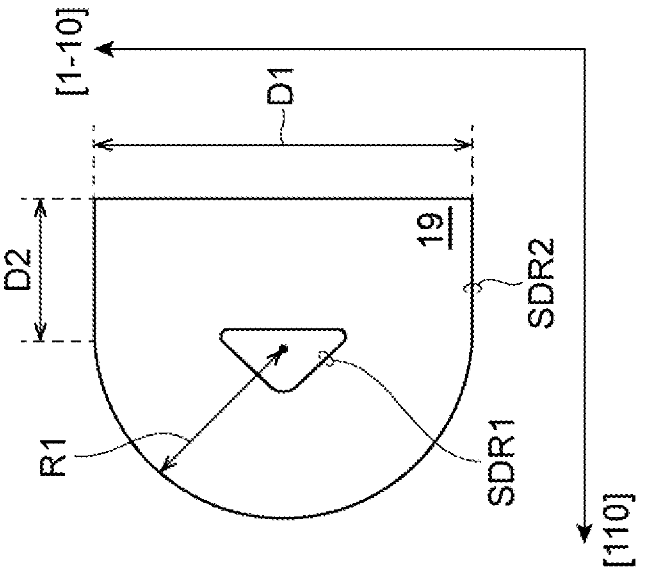
FIG. 4A shows the shape of a carrier confinement structure in a cross-section.
Figure 4B:
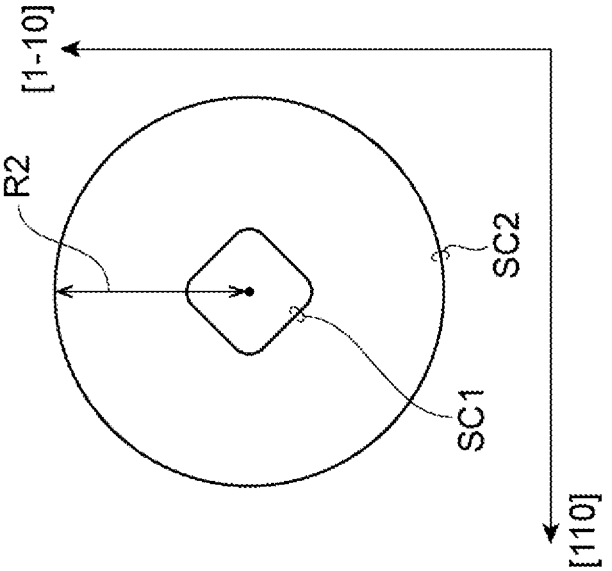
FIG. 4B shows the shape of a carrier confinement structure in a cross-section.

FIGS. 4A and 4B are sectional views showing two shapes of carrier confinement structures.

Uniaxially Symmetric Carrier Confinement Structure

Referring to FIG. 4A, the edge SDR1 of the current aperture region 23*a* is produced by the post structure 19 having a following shape of the edge SDR2. A line segment of the edge SDR2 (length D1: 30 μm) is extending in the direction along the [1-10] axis. A semicircle of the edge SDR2 (radius R1: 15 μm) is projecting in the direction along the axis. The line segment is connected to the semicircle via a pair of line segments (length D2: 10 μm) extending in the direction along the [110] axis. As used herein, "uniaxially symmetric" refers to a shape having only one axis of line symmetry. In FIG. 4A, the shape of the current aperture region 23*a* in a cross-section has line symmetry with respect to a single axis, i.e., the [110] axis. This symmetry in the shape of the edge SDR1 is associated with the uniaxially symmetric shape of the edge SDR2.

Biaxially Symmetric Carrier Confinement Structure

Referring to FIG. 4B, the current aperture region of the carrier confinement structure has a shape defined by an edge SC1, specifically, a square shape with four rounded corners (biaxially symmetric). The post structure that can provide the edge SC1 has a top surface with a shape defined by an edge SC2, specifically, a circular shape (radius R2: 15 μm). As used herein, "biaxially symmetric" refers to a shape having two axes of line symmetry. In FIG. 4B, the shape of the current aperture region 23*a* in a cross-section has line symmetry with respect to two orthogonal axes, i.e., the [110] axis and the [1-10] axis.

Figure 5B:
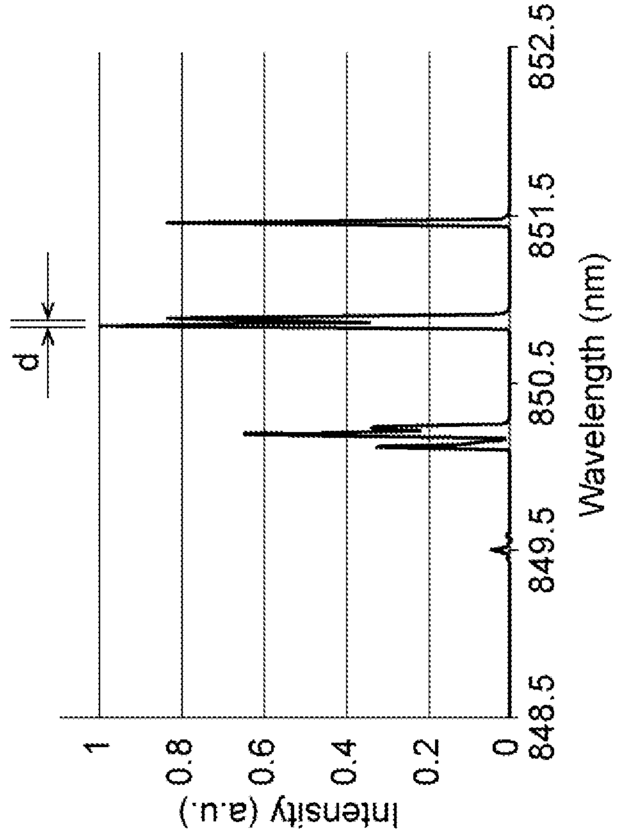
FIG. 5B shows the oscillation spectrum of a vertical cavity surface-emitting laser having a biaxially symmetric carrier confinement structure.
Figure 5A:
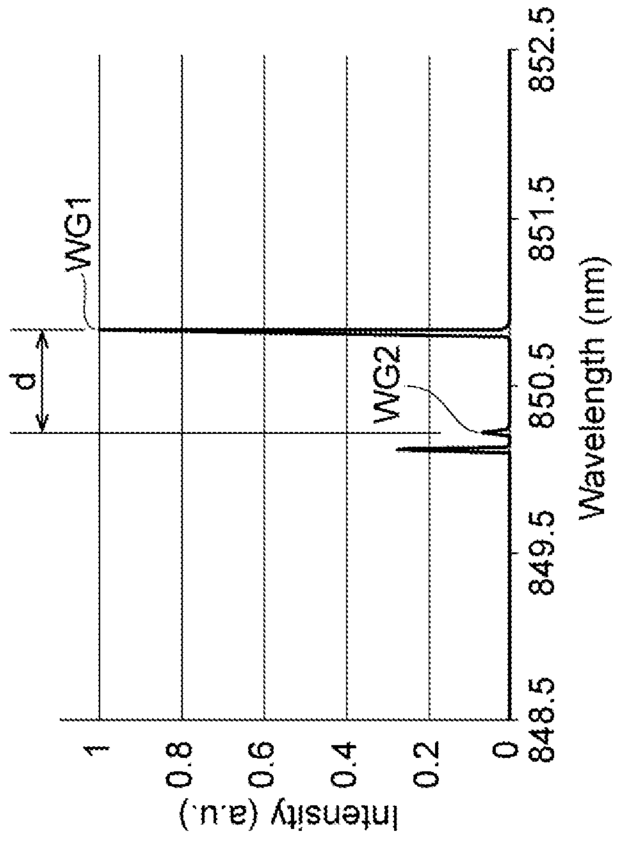
FIG. 5A shows the oscillation spectrum of a vertical cavity surface-emitting laser having a uniaxially symmetric carrier confinement structure.

FIG. 5A shows the oscillation spectrum of a vertical cavity surface-emitting laser having a uniaxially symmetric carrier confinement structure. FIG. 5B shows the oscillation spectrum of a vertical cavity surface-emitting laser having a biaxially symmetric carrier confinement structure. As will be understood from these oscillation spectra, the vertical cavity surface-emitting lasers oscillate in multiple modes. The measurement temperature is 25° C. The current through the vertical cavity surface-emitting lasers is 10 mA.

The oscillation spectrum shown in FIG. 5A has a wavelength interval d of 0.5 nm between a first peak WG1 and a second peak WG2 adjacent to the first peak WG1. The relative intensity noise (RIN), which is noise in the laser, is −134 dB/Hz. The spectral width determined by the root mean square method (RMS) is 0.39 nm.

The oscillation spectrum shown in FIG. 5B has a wavelength interval d of 0.1 nm between a first peak and a second peak adjacent to the first peak. The noise in the laser (relative intensity noise (RIN)) is −130 dB/Hz. The spectral width (RMS) is 0.53 nm.

The geometric symmetry of the shape of the current aperture of a carrier confinement structure defines the distribution of the flow of carriers in the active layer. The vertical cavity surface-emitting laser having the uniaxially symmetric carrier confinement structure produces a reduced noise (RIN).

According to this example, the oscillation spectrum of the vertical cavity surface-emitting laser having the uniaxially symmetric carrier confinement structure contains fewer main modes than the oscillation spectrum of the vertical cavity surface-emitting laser having the biaxially symmetric carrier confinement structure. The laser containing fewer numbers of main modes produces more stable laser oscillation than the laser with larger numbers of main modes.

The oscillation spectrum of the vertical cavity surface-emitting laser having the uniaxially symmetric carrier confinement structure has a larger adjacent peak interval than the oscillation spectrum of the vertical cavity surface-emitting laser having the biaxially symmetric carrier confinement structure. The laser having a larger peak interval produces more stable laser oscillation than the laser with closer peak intervals.

The vertical cavity surface-emitting laser 11 exhibits reduced overlap between transverse modes and reduced conflict between transverse modes. Thus, the laser 11 produces a reduced noise (MN), and a stable laser oscillation.

Figure 6:
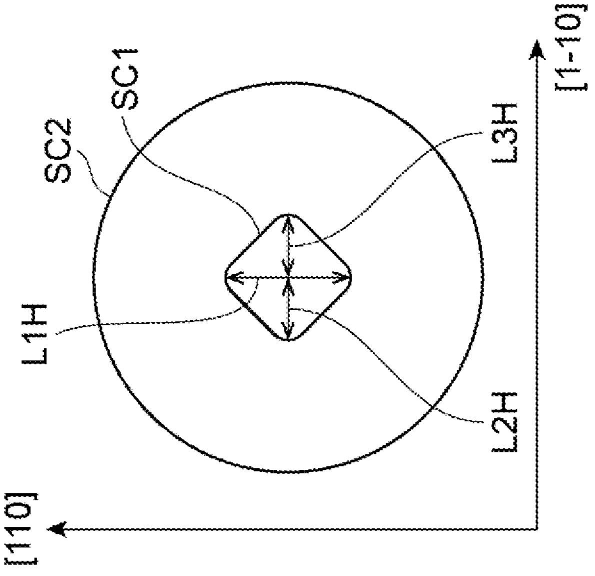
FIGS. 6A, 6B, and 6C are schematic sectional views of typical biaxially symmetric carrier confinement structures.
Figure 6B:
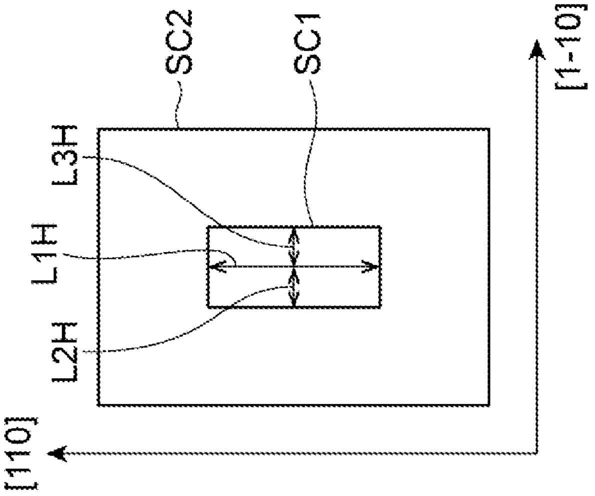
Figure 6C:
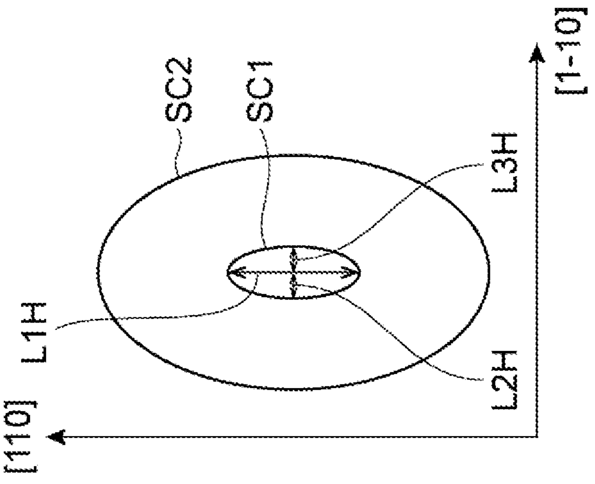

FIGS. 6A, 6B, and 6C are schematic sectional views of typical biaxially symmetric carrier confinement structures. The carrier confinement structures have a current aperture region defined by the edge SC1 within a post structure defined by the edge SC2.

For each shape, a first length L1H, a second length L2H, and a third length L3H are defined in the same manner as the first length L1G, the second length L2G, and the third length L3G and are shown in FIGS. 6A, 6B, and 6C.

FIG. 6A shows a post structure (SC2) having a circular top surface. The carrier confinement structure has a current aperture region (SC1). In the current aperture region (SC1), the second length L2H is equal to the third length L3H, and the first length L1H is equal to the sum of the second length L2H and the third length L3H.

FIG. 6B shows a post structure (SC2) having a rectangular top surface. The carrier confinement structure has a current aperture region (SC1). In the current aperture region (SC1), the second length L2H is smaller than the third length L3H if the line segment of the first length L1H is positioned to give the third length L3H the maximum possible value. Alternatively, the second length L2H is smaller than the third length L3H if the line segment of the first length L1H is positioned to give the second length L2H the minimum possible value.

FIG. 6C shows a post structure (SC2) having an elliptical or oval top surface.

The carrier confinement structure has a current aperture region (SC1). In the current aperture region (SC1), the second length L2H is equal to the third length L3H.

FIGS. 7A to 7E and 8A to 8C are schematic views of the main steps of a method for fabricating the vertical cavity surface-emitting laser according to the embodiment.

Figure 7D:
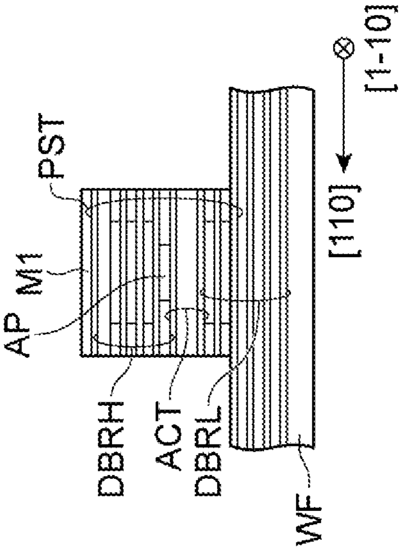
FIGS. 7A to 7E are schematic views of the main steps of a method for fabricating the vertical cavity surface-emitting laser according to the embodiment.
Figure 7E:
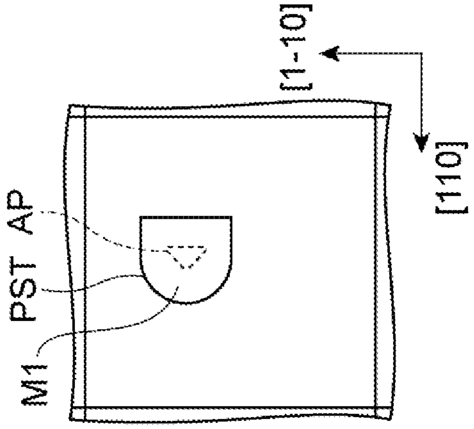
Figure 7B:
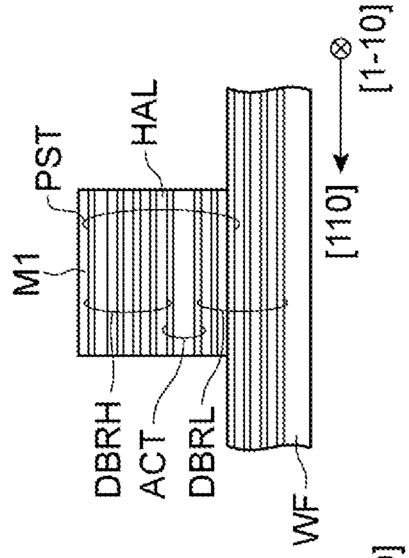
Figure 7C:
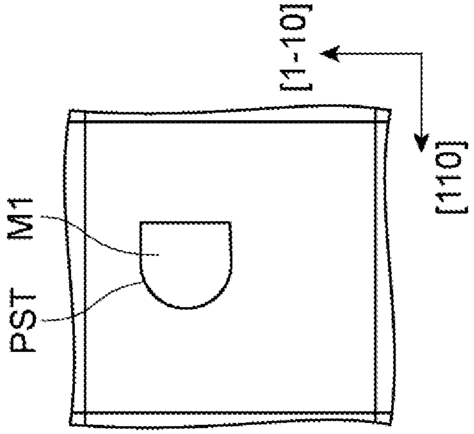
Figure 7A:
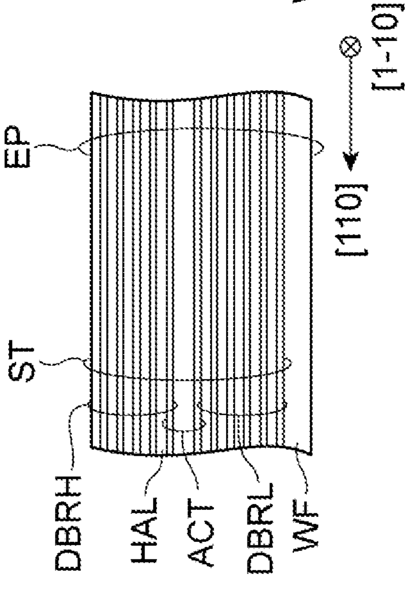

As shown in FIG. 7A, an epitaxial substrate EP is fabricated. Specifically, a GaAs wafer WF is provided. A stacked semiconductor layer ST is grown on the GaAs wafer WF. This growth is performed, for example, by a metal-organic vapor phase epitaxy method. The stacked semiconductor layer ST includes an n-type semiconductor layer DBRL, a semiconductor layer ACT for an active layer region, and a p-type semiconductor layer DBRH. The p-type semiconductor layer DBRH includes a high-aluminum-content III-V group compound semiconductor layer (e.g., AlAs or AlGaAs) for a carrier confinement structure. The n-type semiconductor layer DBRL includes semiconductor films for a lower distributed Bragg reflector. The p-type semiconductor layer DBRH includes semiconductor films for an upper distributed Bragg reflector and a high-aluminum-content III-V group compound semiconductor layer HAL (e.g., AlAs or AlGaAs) for a carrier confinement structure. The semiconductor layer ACT includes semiconductor films for an active layer and spacer layers.

As shown in FIG. 7B, a dielectric mask M1 is formed on the epitaxial substrate EP. The dielectric mask M1 is used to etch the epitaxial substrate EP, thereby forming a post structure PST. The dielectric mask M1 defines the shape of the post structure PST. Referring to FIG. 7C, the dielectric mask M1 in this example has a pattern with a single axis of symmetry oriented in the [110] crystal axis direction. The symmetry of the dielectric mask M1 is inherited to the symmetry of the current aperture region formed in the subsequent oxidation process. However, the current aperture region often has a different planar shape from the dielectric mask M1 because of the anisotropy of the oxidation rate of the semiconductor.

As shown in FIG. 7D, the semiconductor post structure PST is exposed to an oxidizing atmosphere to oxidize the III-V group compound semiconductor layer HAL, thereby forming a current aperture region AP.

An example of the oxidation process is shown below:

Oxidizing atmosphere: high-temperature water vapor, hydrogen-oxygen gas mixture

Oxidation temperature: 300° C. to 500° C.

Referring to FIG. 7E, as described above, the current aperture region AP has a different planar shape from the dielectric mask M1. Although the current aperture region has a different planar shape from the post structure PST, the symmetry of the post structure PST is inherited to the current aperture region AP. The dielectric mask M1 is removed after oxidation.

Figure 8A:
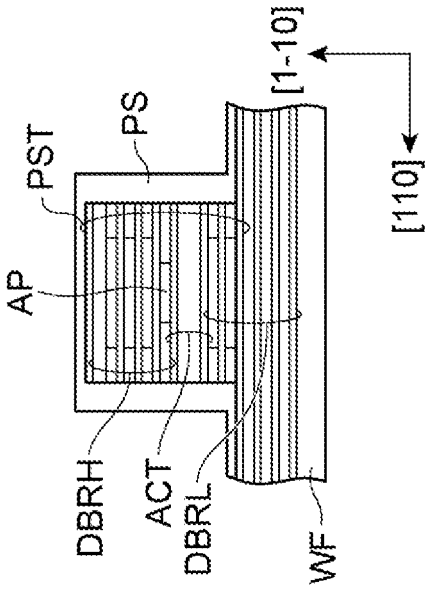
FIGS. 8A to 8C are schematic views of the main steps of the method for fabricating the vertical cavity surface-emitting laser according to the embodiment.

As shown in FIG. 8A, a silicon-based inorganic insulator PS for a passivation layer is grown over the entire surface of the wafer WF by a vapor deposition method.

Figure 8B:
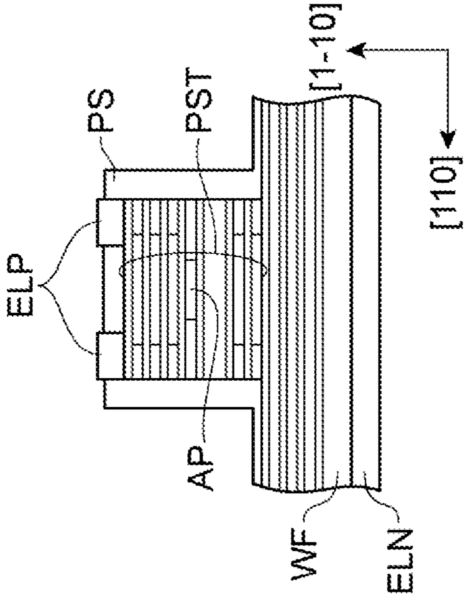
Figure 8C:
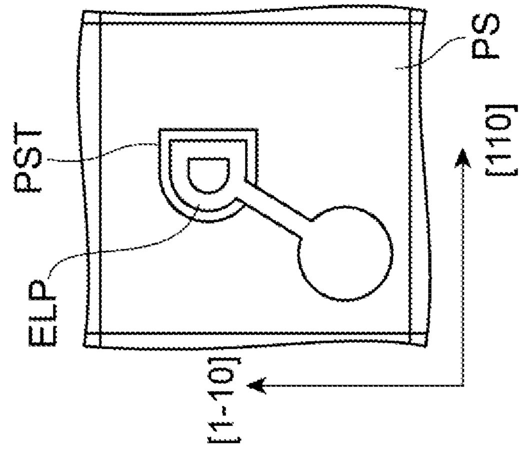

As shown in FIGS. 8B and 8C, after the growth of the silicon-based inorganic insulator PS, an opening is formed above the top surface of the post structure PST by photolithography and etching, and a top electrode ELP is formed. In addition, a lower electrode ELN is formed on the back surface of the wafer WF.

After these steps, the vertical cavity surface-emitting laser 11 is finished.

The post structure 19 and the current aperture region 23*a* will now be described with reference to FIGS. 9 to 16. FIGS. 9 to 16, as is FIG. 2, are sectional views of post structures and current aperture regions taken along the first reference plane R1EF crossing the direction along the first axis Ax1.

Specific Example 1

Figure 9:
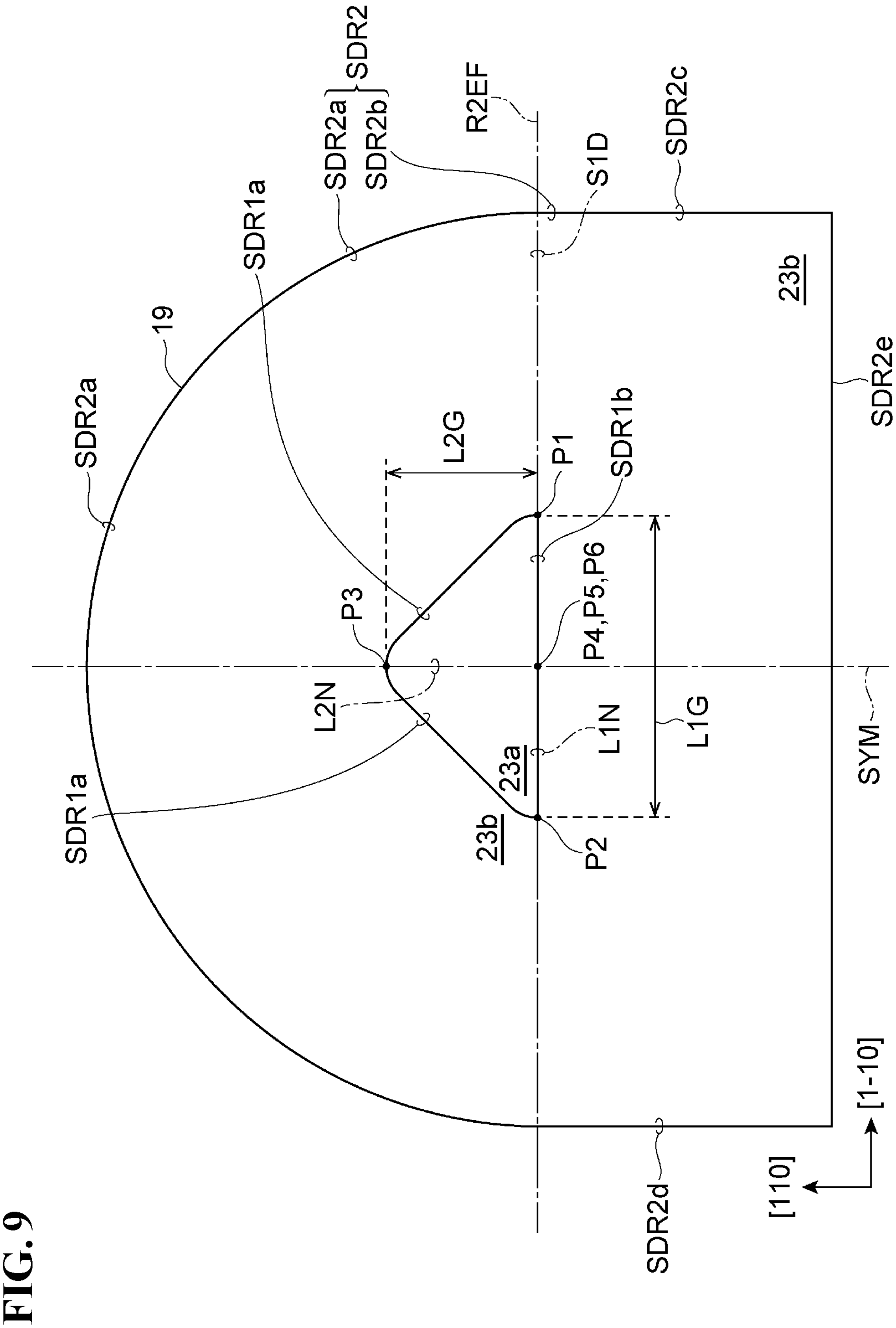
FIG. 9 is a sectional view equivalent to a sectional view taken along line II-II in FIG. 1, showing a specific carrier confinement structure of the vertical cavity surface-emitting laser according to the embodiment.

Referring to FIG. 9, the edge SDR1 of the current aperture region 23*a* and the edge SDR2 of the post structure 19 are shown in solid lines. The cross-section of the current aperture region 23*a* has a projecting shape defined by the edge SDR1.

The first reference plane R1EF crosses a second reference plane R2EF at a first reference line segment L1N. The second reference plane R2EF extends along the first axis AX1. The first line segment L1N join a first point P1 and a second point P2 on the edge SDR1 of the cross-section of the current aperture region 23*a* (the cross-section shown in FIG. 9). The edge SDR1 has a first portion SDR1*a* and a second portion SDR1*b* that are delimited by the first point P1 and the second point P2. In the vertical cavity surface-emitting laser 11 exemplified in Specific Example 1, the first to third line segments L1N, L2N and L3N satisfy with first to third conditions described bellow.

First Condition

The first reference line segment L1N extends in the [1-10] direction of the III-V group compound semiconductor. The first reference line segment L1N is one of a first set of line segments joining two points on the first portion SDR1*a*. The first line segment L1N is not shorter than any other line segment of the first set of line segments (i.e., is longer than or equal to any other line segment).

In this example, the first reference line segment L1N is uniquely determined.

Second Condition

The first reference line segment L1N makes a right angle with a second reference line segment L2N joining a third point P3 and a fourth point P4. The third point P3 is on the first portion SDR1*a* of the edge SDR1 and the fourth point P4 is on the first reference line segment L1N. The second reference line segment L2N is one of a second set of line segments and is not shorter than any other line segment of the second set of line segments (i.e., is longer than or equal to any other line segment). The second set of line segments is a group of line segments each of which joins a point on the first portion SDR1*a* and a point on the first reference line segment L1N with making a right angle with the first reference line segment L1N.

In this example, the second reference line segment L2N is uniquely determined.

Third Condition

In this example, the first reference line segment L1N lies on the second portion SDR1*b* of the edge SDR1. Accordingly, the fifth point P5 on the second portion SDR1*b* of the edge SDR1 and the sixth point P6 on the first reference line segment L1N lie at the same position as the fourth point P4. As a result, the third length L3G of the third reference line segment L3N is zero. Consequently, the third set of line segments is a set of line segments with a length of zero (L3G=0).

The first length L1G of the first reference line segment L1N is greater than the sum of the second length L2G of the second reference line segment L2N and the third length L3G of the third reference line segment L3N (L1G>L2G+L3G; L1G>L2G; and L1G>L3G). The third length L3G of the third reference line segment L3N is smaller than the second length L2G of the second reference line segment L2N and is zero (0≤L3G<L2G).

The shape of the post structure 19 will now be described. The edge SDR2 of the post structure 19 includes a first portion SDR2*a* projecting in the [110] crystal axis direction and a second portion SDR2*b*. The first portion SDR2*a* and the second portion SDR2*b* are delimited by the crossing line S1D. The second portion SDR2*b* includes a third portion SDR2*c* extending in the [110] crystal axis direction, a fourth portion SDR2*d* extending in the [110] crystal axis direction, and a fifth portion SDR2*e* extending in the [1-10] crystal axis direction. Both ends of the first portion SDR2*a* connect to both ends of the fifth portion SDR2*e* via the third portion SDR2*c* and the fourth portion SDR2*d*, respectively, thereby defining the closed edge SDR2. The first portion SDR2*a* has, for example, a semicircular shape. The third portion SDR2*c*, the fourth portion SDR2*d*, and the fifth portion SDR2*e* are line segments. The shape of the post structure 19 is defined by, for example, a rectangle and a semicircle having a diameter equal to the length of the long sides of the rectangle and adjoining one of the long sides of the rectangle.

An example of the post structure 19 is shown below:

Radius of semicircle: 15 μm

Length of third portion SDR2*c* and fourth portion SDR2*d* (short sides of rectangle): 10 μm Length of fifth portion SDR2*e* (long side of rectangle): 30 μm The edge SDR1 is a substantial isosceles triangle having a rounded vertex angle and acute base angles. The roundness of the vertex angle of the edge SRD1 of the current aperture region 23*a* results from the arc shape of the edge SDR2 of the post structure 19.

The shape defined by the edge SDR2 of the post structure 19 and the edge SDR1 of the current aperture region 23*a* has a single axis of symmetry SYM extending on the second reference line segment L2N. The axis of symmetry SYM extends through the midpoint of the first width W1 on the second reference line segment L2N.

Specific Example 2

Figure 10:
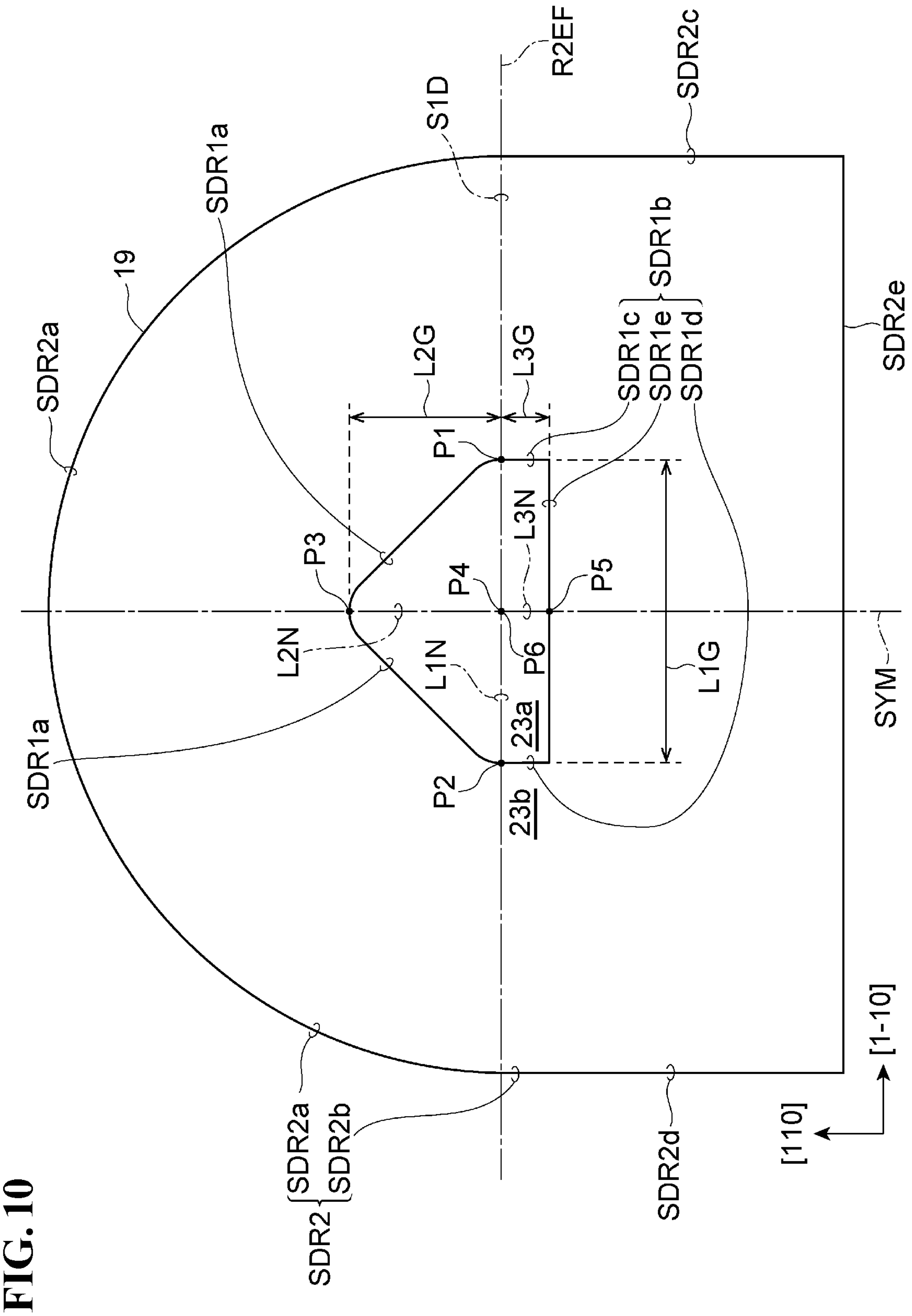
FIG. 10 is a sectional view equivalent to a sectional view taken along line II-II in FIG. 1, showing a specific carrier confinement structure of the vertical cavity surface-emitting laser according to the embodiment.

Referring to FIG. 10, the edge SDR1 of the current aperture region 23*a* and the edge SDR2 of the post structure 19 are shown in solid lines. The cross-section of the current aperture region 23*a* has a projecting shape defined by the edge SDR1.

The first reference plane R1EF crosses a second reference plane R2EF at a first reference line segment L1N. The second reference plane R2EF extends along the first axis AX1. The first line segment L1N joins a first point P1 and a second point P2 on the edge SDR1 of the cross-section of the current aperture region 23*a* (the cross-section shown in FIG. 10). The edge SDR1 has a first portion SDR1*a* and a second portion SDR1*b* that are delimited by the first point P1 and the second point P2.

As shown in FIG. 10, the first reference line segment L1N meets the first condition of Specific Example 1. The first reference line segment L1N and the second reference line segment L2N meet the second condition of Specific Example 1.

In this example, the second reference line segment L2N is uniquely determined. The third reference line segment L3N satisfies with Fourth Condition described bellow.

Fourth Condition

The first reference line segment L1N makes a right angle with a third reference line segment L3N joining a fifth point P5 on the second portion SDR1*b* of the edge SDR1 to a sixth point P6 on the first reference line segment L1N. The third reference line segment L3N is one of a third set of line segments and is not shorter than any other line segment of the third set of line segments (i.e., is longer than or equal to any other line segment). The third set of line segments is a group of line segments each of which joins a point on the second portion SDR1*b* and a point on the first reference line segment L1N with making a right angle with the first reference line segment L1N. The first reference line segment L1N and the third reference line segment L3N meet the fourth condition, rather than the third condition.

In this example, the first reference line segment L1N and the third reference line segment L3N are not uniquely determined. The first reference line segment L1N is positioned to give the second length L2G the minimum possible value. As a result, the first reference line segment L1N is positioned to give the third length L3G the maximum possible value. In this arrangement, the second length L2G is greater than the third length L3G. The third reference line segment L3N is not uniquely determined. Referring to FIG. 10, the third reference line segment L3N is shown as aligned with the second reference line segment L2N.

The edge SDR1 is defined by, for example, a rectangle and a substantial isosceles triangle sharing a base with the rectangle. The substantial isosceles triangle has the base with a length equal to the length of the long sides of the rectangle and adjoining one of the long sides of the rectangle. The substantial isosceles triangle has a rounded vertex angle. The edge SDR1 has no acute angle since the rectangle added to the isosceles triangle adds the right angles at the vertices of the rectangle to the base angles of the isosceles triangle.

The first length L1G of the first reference line segment L1N is greater than the sum of the second length L2G of the second reference line segment L2N and the third length L3G of the third reference line segment L3N ($L1G>L2G+L3G$; $L1G>L2G$; and $L1G>L3G$). The third length L3G of the third reference line segment L3N is smaller than the second length L2G of the second reference line segment L2N ($0<L3G<L2G$).

The shape of the post structure 19 will now be described. The edge SDR2 of the post structure 19 includes a first portion SDR2*a* projecting in the [110] crystal axis direction and a second portion SDR2*b*. The first portion SDR2*a* and the second portion SDR2*b* are delimited by the crossing line S1D. The second portion SDR2*b* includes a third portion SDR2*c* extending in the [110] crystal axis direction, a fourth portion SDR2*d* extending in the [110] crystal axis direction, and a fifth portion SDR2*e* extending in the [1-10] crystal axis direction. Both ends of the first portion SDR2*a* connect to both ends of the fifth portion SDR2*e* via the third portion SDR2*c* and the fourth portion SDR2*d*, respectively, thereby defining the closed edge SDR2. The first portion SDR2*a* has, for example, a semicircular shape. The third portion SDR2*c*, the fourth portion SDR2*d*, and the fifth portion SDR2*e* are line segments. The shape of the post structure 19 is defined by, for example, a rectangle and a semicircle having a diameter equal to the length of the long sides of the rectangle and adjoining one of the long sides of the rectangle.

An example of the post structure 19 is shown below:

Radius of semicircle: 15 μm

Length of long sides of rectangle (SDR2*e* and S1D): 30 μm

Length of short sides of rectangle (SDR2*c* and SDR2*d*): 11 μm

The short sides SDR2*c*, SDR2*d* of the rectangle of the edge SDR2 shown in FIG. 10 are longer than the short sides SDR2*c*, SDR2*d* of the rectangle of the edge SDR2 shown in FIG. 9.

The shape defined by the edge SDR2 of the post structure 19 and the edge SDR1 of the current aperture region 23*a* has an axis of symmetry SYM extending on the second reference line segment L2N. The axis of symmetry SYM extends through the midpoint of the first width W1 on the second reference line segment L2N. The axis of symmetry SYM also extends through the midpoint of the second width W2 on the third reference line segment L3N.

Specific Example 3

Figure 11:
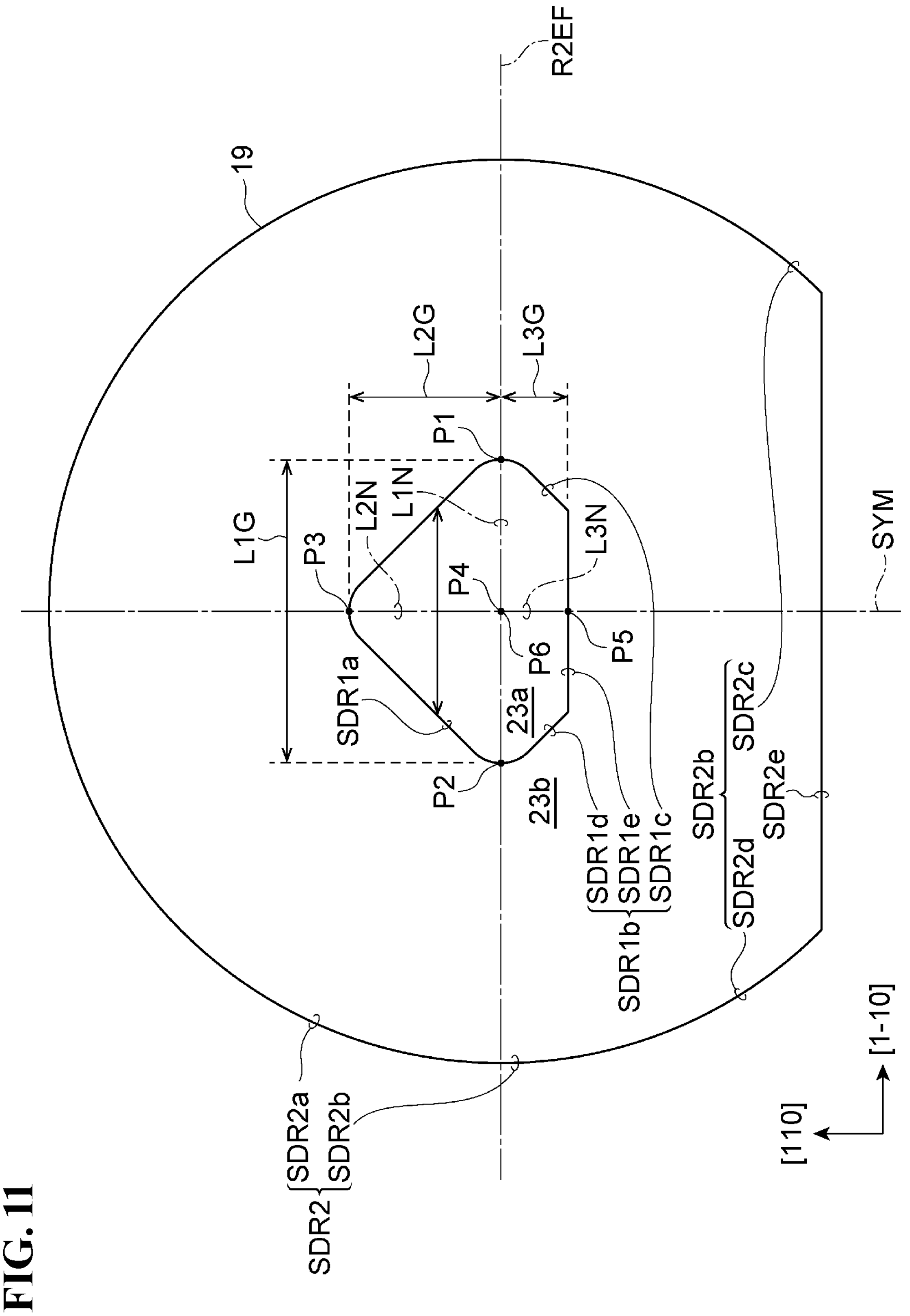
FIG. 11 is a sectional view equivalent to a sectional view taken along line II-II in FIG. 1, showing a specific carrier confinement structure of the vertical cavity surface-emitting laser according to the embodiment.

Referring to FIG. 11, the edge SDR1 of the current aperture region 23*a* and the edge SDR2 of the post structure 19 are shown in solid lines. The cross-section of the current aperture region 23*a* has a projecting shape defined by the edge SDR1.

The first reference plane R1EF crosses a second reference plane R2EF extending in the direction along the first axis Ax1 at a first reference line segment L1N. The first reference line segment L1N joins a first point P1 and a second point P2 on the edge SDR1 of the cross-section defined by the crossing of the first reference plane R1EF and the current aperture region 23*a* (the cross-section shown in FIG. 11). The edge SDR1 has a first portion SDR1*a* and a second portion SDR1*b* that are delimited by the first point P1 and the second point P2.

As shown in FIG. 11, the first reference line segment L1N meets the first condition. The first reference line segment L1N and the second reference line segment L2N meet the second condition. The first reference line segment L1N and the third reference line segment L3N meet the fourth condition.

In this example, the first reference line segment L1N is uniquely determined. The second reference line segment L2N is uniquely determined.

In this example, the third reference line segment L3N is not uniquely determined. Referring to FIG. 11, the third reference line segment L3N is shown as aligned with the second reference line segment L2N.

The edge SDR1 includes a first portion SDR1*a* projecting in the [110] crystal axis direction and a second portion SDR1*b* projecting away from the first portion SDR1*a* in the [110] crystal axis direction. Specifically, the edge SDR1 is defined by a substantial isosceles trapezoid and a substantial isosceles triangle. The substantial isosceles trapezoid has a long base and a short base, and the substantial isosceles triangle shares a base with the substantial isosceles trapezoid. The substantial isosceles triangle has the base whose a length is equal to the length of the long base of the isosceles trapezoid. The long bases of the isosceles trapezoid and the isosceles triangle are adjoined each other on the first reference line segment L1N. The substantial isosceles triangle has a rounded vertex angle, and the isosceles trapezoid has obtuse angles. The edge SDR1 has no acute angle since the isosceles trapezoid adds the rounded acute angles at the vertices of the isosceles trapezoid to the base angles of the isosceles triangle.

The first length L1G of the first reference line segment L1N is greater than the sum of the second length L2G of the second reference line segment L2N and the third length L3G of the third reference line segment L3N ($L1G>L2G+L3G$;

L1G>L2G; and L1G>L3G). The third length L3G of the third reference line segment L3N is smaller than the second length L2G of the second reference line segment L2N (0<L3G<L2G).

The shape of the post structure 19 will now be described. The edge SDR2 of the post structure 19 includes a first portion SDR2*a* projecting in the [110] crystal axis direction and a second portion SDR2*b* projecting away from the first portion SDR2*a* in the [110] crystal axis direction. The first portion SDR2*a* and the second portion SDR2*b* are delimited by the crossing line S1D. The first portion SDR2*a* and the second portion SDR2*b* each have a projecting shape. Specifically, the first portion SDR2*a* includes a convex curve. The second portion SDR2*b* includes a third portion SDR2*c*, a fourth portion SDR2*d*, and a fifth portion SDR2*e*. The third portion SDR2*c* and the fourth portion SDR2*d* include, for example, a convex curve. The fifth portion SDR2*e* is a line segment. The shape of the post structure 19 is defined by, for example, a substantial arc and a line segment connecting both ends of the arc. The substantial arc has a central angle greater than 180° and smaller than 360°.

An example of the post structure 19 is shown below:

Radius of arc: 15 μm

Central angle of arc: 270°

Length of fifth portion SDR2*e:* 21 μm

The shape defined by the edge SDR2 of the post structure 19 and the edge SDR1 of the current aperture region 23*a* has an axis of symmetry SYM extending on the second reference line segment L2N. The axis of symmetry SYM extends through the midpoint of the first width W1 on the second reference line segment L2N. The axis of symmetry SYM also extends through the midpoint of the second width W2 on the third reference line segment L3N.

Specific Example 4

Figure 12:
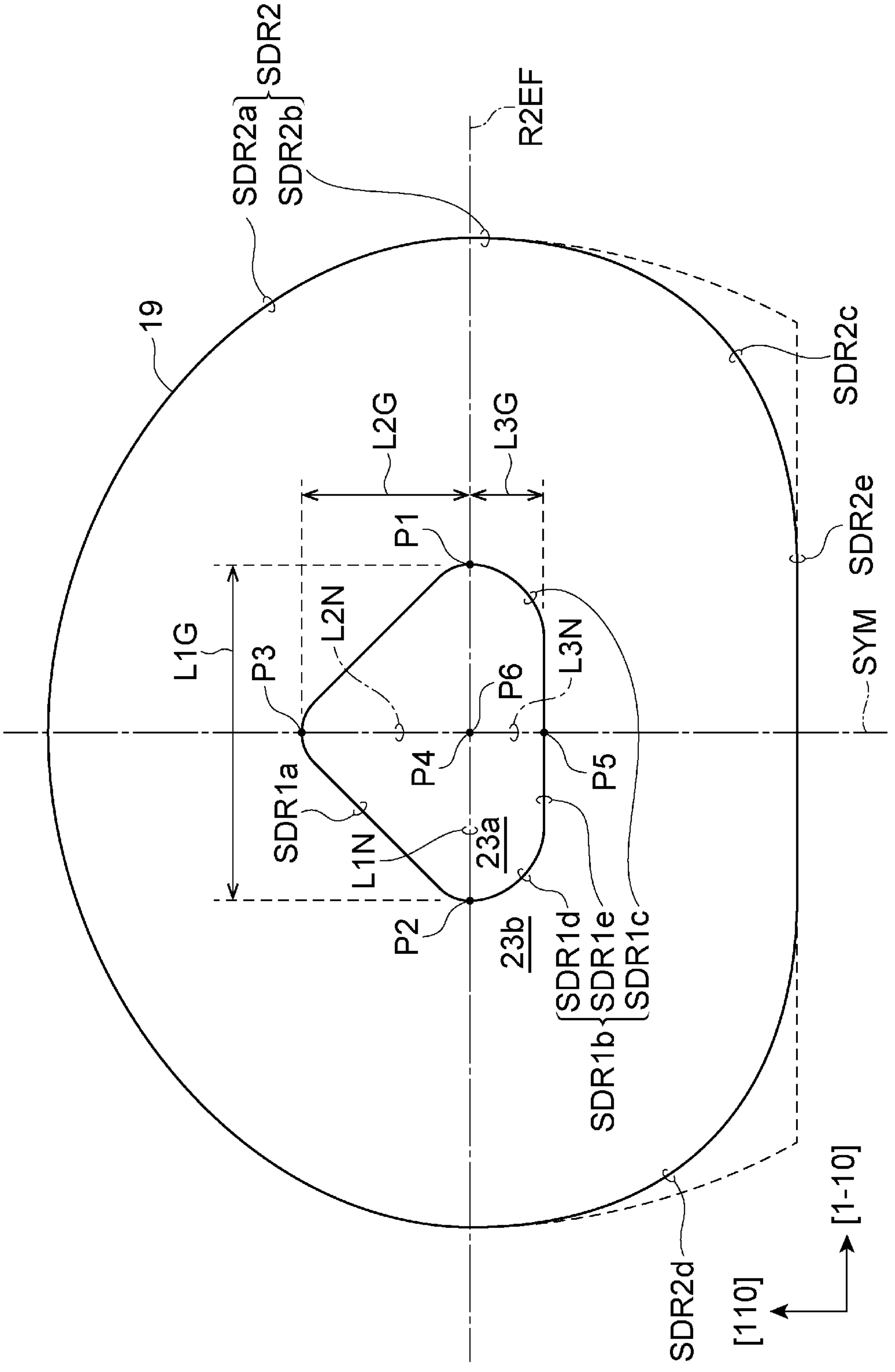
FIG. 12 is a sectional view equivalent to a sectional view taken along line II-II in FIG. 1, showing a specific carrier confinement structure of the vertical cavity surface-emitting laser according to the embodiment.

Referring to FIG. 12, the edge SDR1 of the current aperture region 23*a* and the edge SDR2 of the post structure 19 are shown in solid lines. The cross-section of the current aperture region 23*a* has a projecting shape defined by the edge SDR1.

The first reference plane R1EF crosses a second reference plane R2EF extending in the direction along the first axis Ax1 at a first reference line segment L1N. The first reference line segment L1N joins a first point P1 and a second point P2 on the edge SDR1 of the cross-section defined by the crossing of the first reference plane R1EF and the current aperture region 23*a* (the cross-section shown in FIG. 12). The edge SDR1 has a first portion SDR1*a* and a second portion SDR1*b* that are delimited by the first point P1 and the second point P2.

As shown in FIG. 12, the first reference line segment L1N meets the first condition. The first reference line segment L1N and the second reference line segment L2N meet the second condition. The first reference line segment L1N and the third reference line segment L3N meet the fourth condition.

In this example, the first reference line segment L1N is uniquely determined. In this example, the second reference line segment L2N is uniquely determined.

In this example, the third reference line segment L3N is not uniquely determined. Referring to FIG. 12, the third reference line segment L3N is shown as aligned with the second reference line segment L2N.

The edge SDR1 includes a first portion SDR1*a* projecting in the [110] crystal axis direction and a second portion SDR1*b* projecting away from the first portion SDR1*a* in the [110] crystal axis direction. Specifically, the edge SDR1 is defined by a substantial isosceles trapezoid and a substantial isosceles triangle. The substantial isosceles trapezoid has a long base and a short base, and the substantial isosceles triangle has a base with a length equal to the length of the long base of the isosceles trapezoid. The long bases of the isosceles trapezoid and the isosceles triangle are adjoined each other on the first reference line segment L1N. The substantial isosceles triangle has a rounded vertex angle, and the isosceles trapezoid has rounded obtuse angles. The edge SDR1 has no acute angle at the two vertices shared by the base of the isosceles triangle and the long base of the isosceles trapezoid, but has rounded angles at the shared vertices, since the isosceles trapezoid adds the rounded acute angles at the vertices of the isosceles trapezoid to the base angles of the isosceles triangle.

The first length L1G of the first reference line segment L1N is greater than the sum of the second length L2G of the second reference line segment L2N and the third length L3G of the third reference line segment L3N (L1G>L2G+L3G; L1G>L2G; and L1G>L3G). The third length L3G of the third reference line segment L3N is smaller than the second length L2G of the second reference line segment L2N (0<L3G<L2G).

The shape of the post structure 19 will now be described. The edge SDR2 of the post structure 19 includes a first portion SDR2*a* projecting in the [110] crystal axis direction and a second portion SDR2*b* projecting away from the first portion SDR2*a* in the crystal axis direction. The first portion SDR2*a* and the second portion SDR2*b* are delimited by the crossing line S1D. The first portion SDR2*a* and the second portion SDR2*b* each have a projecting shape. Specifically, the first portion SDR2*a* includes a convex curve. The second portion SDR2*b* includes a third portion SDR2*c* that is a convex curve, a fourth portion SDR2*d* that is a convex curve, and a fifth portion SDR2*e* extending in the [1-10] crystal axis direction. Both ends of the first portion SDR2*a* connect to both ends of the fifth portion SDR2*e* via the third portion SDR2*c* and the fourth portion SDR2*d*, respectively, thereby defining the closed edge SDR2. The first portion SDR2*a* has, for example, a semicircular shape with a large radius of curvature. The third portion SDR2*c* and the fourth portion SDR2*d* have, for example, a sector shape with a central angle of 90° and a small radius of curvature. As indicated by the dashed lines, the third portion SDR2*c* and the fourth portion SDR2*d* have a smaller radius of curvature than the first portion SDR2*a.*

An example of the post structure 19 is shown below:

Radius of large arc: 15 μm

Radius of small arc: 11 μm

Length of fifth portion SDR2*e:* 8 μm

The shape of the post structure 19 is defined by, for example, a convex curve including a plurality of arcs having a plurality of radii of curvature and smoothly connecting to each other and a line segment connecting both ends of the convex curve.

The shape defined by the edge SDR2 of the post structure 19 and the edge SDR1 of the current aperture region 23*a* has an axis of symmetry SYM extending on the second reference line segment L2N. The axis of symmetry SYM extends through the midpoint of the first width W1 on the second reference line segment L2N. The axis of symmetry SYM also extends through the midpoint of the second width W2 on the third reference line segment L3N.

Specific Example 5

Figure 13:
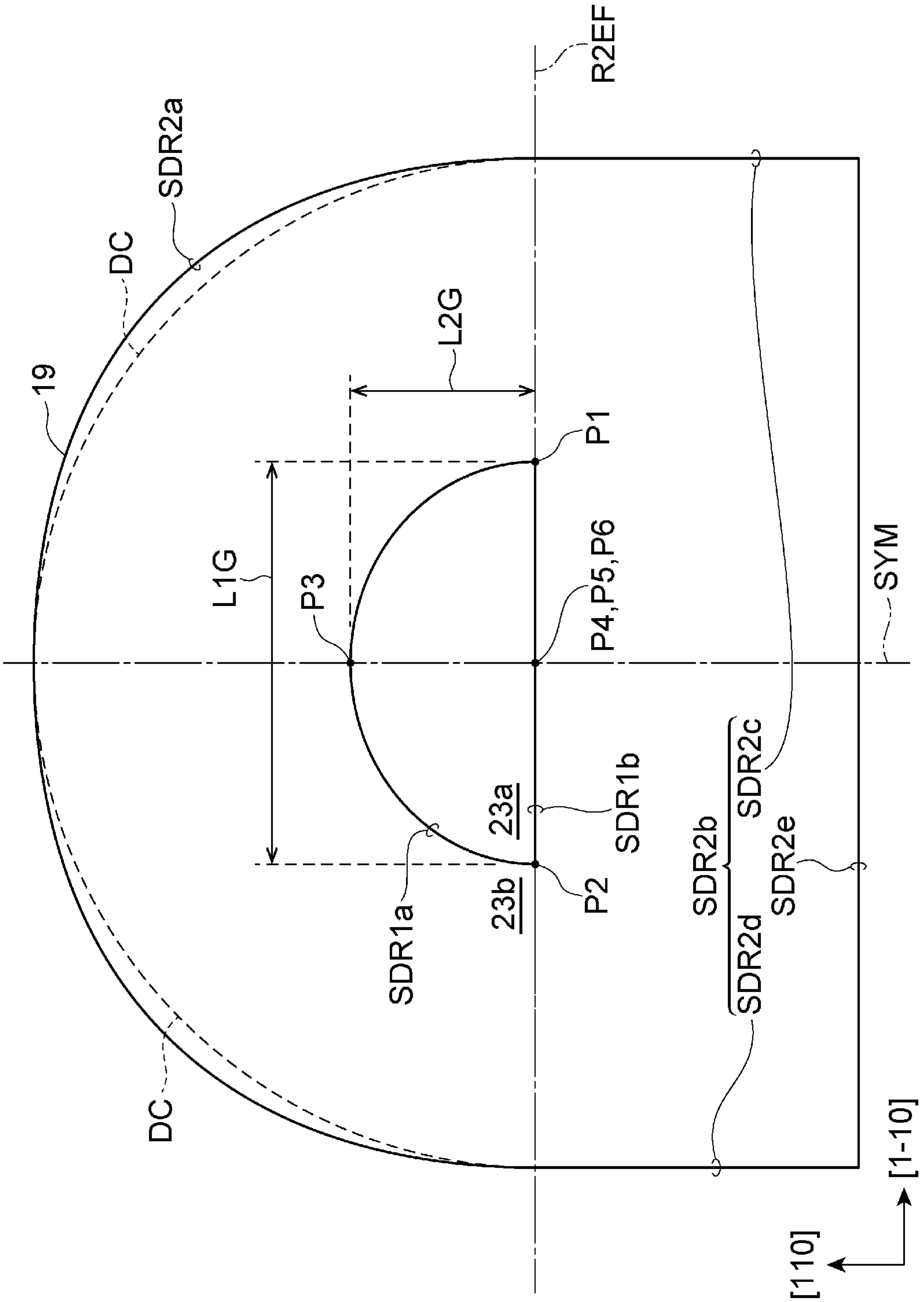
FIG. 13 is a sectional view equivalent to a sectional view taken along line II-II in FIG. 1, showing a specific carrier confinement structure of the vertical cavity surface-emitting laser according to the embodiment.

Referring to FIG. 13, the edge SDR1 of the current aperture region 23*a* and the edge SDR2 of the post structure 19 are shown in solid lines. The first reference plane R1EF crosses a second reference plane R2EF extending in the direction along the first axis Ax1 at a first reference line segment L1N. The first reference line segment L1N joins a first point P1 and a second point P2 on the edge SDR1 of the cross-section defined by the crossing of the first reference plane R1EF and the current aperture region 23*a* (the cross-section shown in FIG. 13). The cross-section of the current aperture region 23*a* has a projecting shape defined by the edge SDR1. The edge SDR1 has a first portion SDR1*a* and a second portion SDR1*b*. The first portion SDR1*a* is projecting in the [100] crystal axis direction, and has a convex curve. The second portion SDR1*b* connects the first point P1 and the second point P2 on the first reference line segment L1N.

As shown in FIG. 13, the first reference line segment L1N meets the first condition. The first reference line segment L1N and the second reference line segment L2N meet the second condition. The first reference line segment L1N and the third reference line segment L3N meet the third condition.

In this example, the first reference line segment L1N is uniquely determined. The second reference line segment L2N is uniquely determined.

The first length L1G of the first reference line segment L1N is greater than the sum of the second length L2G of the second reference line segment L2N and the third length L3G of the third reference line segment L3N (L1G>L2G+L3G; L1G>L2G; and L1G>L3G). The third length L3G of the third reference line segment L3N is smaller than the second length L2G of the second reference line segment L2N and is zero or more (0≤L3G<L2G).

The shape of the post structure 19 will now be described. The edge SDR2 of the post structure 19 includes a first portion SDR2*a* projecting in the [110] crystal axis direction and a second portion SDR2*b*. The first portion SDR2*a* and the second portion SDR2*b* are delimited by the crossing line S1D. The second portion SDR2*b* includes a third portion SDR2*c* extending in the [110] crystal axis direction, a fourth portion SDR2*d* extending in the [110] crystal axis direction, and a fifth portion SDR2*e* extending in the [1-10] crystal axis direction. Both ends of the first portion SDR2*a* connect to both ends of the fifth portion SDR2*e* via the third portion SDR2*c* and the fourth portion SDR2*d*, respectively, thereby defining the closed edge SDR2. The first portion SDR2*a* is, for example, a convex curve. This convex curve includes at least one portion with a smaller radius of curvature than an arc DC indicated by a dashed line at individual points on the curve. The third portion SDR2*c*, the fourth portion SDR2*d*, and the fifth portion SDR2*e* are line segments. The shape of the post structure 19 is defined by, for example, a rectangle and a convex curve connecting to both vertices of one of the long sides of the rectangle. The convex curve includes at least one portion with a radius of curvature greater than or equal to a radius equal to half the length of one of the long sides of the rectangle.

An example of the post structure 19 is shown below:

Radius of arc DC (half distance between seventh point P7 and eighth point P8): 15 μm Length of third portion SDR2*c* and fourth portion SDR2*d*: 10 μm Length of fifth portion SDR2*e*: 30 μm As compared to the shape of the current aperture region 23*a* shown in FIG. 9, the first portion SDR1*a* shown in FIG. 13 is represented by an arc-like convex curve projecting in the [110] crystal axis direction, rather than the two oblique sides of an isosceles triangle.

The shape defined by the edge SDR2 of the post structure 19 and the edge SDR1 of the current aperture region 23*a* has an axis of symmetry SYM extending on the second reference line segment L2N. The axis of symmetry SYM extends through the midpoint of the first width W1 on the second reference line segment L2N. The axis of symmetry SYM also extends through the midpoint of the second width W2 on the third reference line segment L3N.

Specific Example 6

Figure 14:
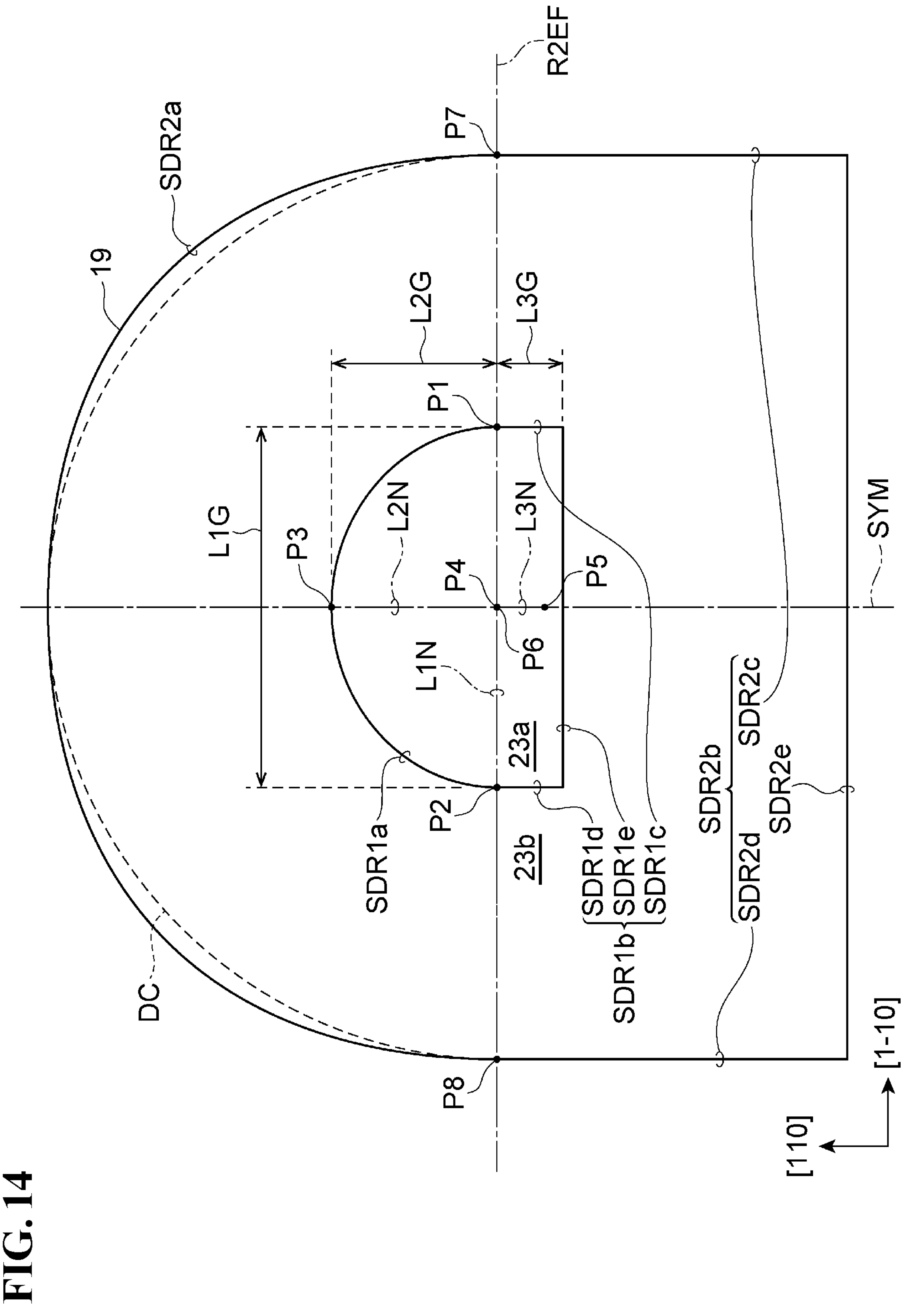
FIG. 14 is a sectional view equivalent to a sectional view taken along line II-II in FIG. 1, showing a specific carrier confinement structure of the vertical cavity surface-emitting laser according to the embodiment.

Referring to FIG. 14, the edge SDR1 of the current aperture region 23*a* and the edge SDR2 of the post structure 19 are shown in solid lines. The cross-section of the current aperture region 23*a* has a projecting shape defined by the edge SDR1.

The first reference plane R1EF crosses a second reference plane R2EF extending in the direction along the first axis Ax1 at a first reference line segment L1N. The first reference line segment L1N joins a first point P1 and a second point P2 on the edge SDR1 of the cross-section defined by the crossing of the first reference plane R1EF and the current aperture region 23*a* (the cross-section shown in FIG. 14). The edge SDR1 has a first portion SDR1*a* and a second portion SDR1*b* that are delimited by the first point P1 and the second point P2. The first portion SDR1*a* has a convex curve and a rectangle, and a long side of the rectangle adjoins with the convex curve.

As shown in FIG. 14, the first reference line segment L1N meets the first condition. The first reference line segment L1N and the second reference line segment L2N meet the second condition. The first reference line segment L1N and the third reference line segment L3N meet the fourth condition.

In this example, the second reference line segment L2N is uniquely determined.

In this example, the first reference line segment L1N and the third reference line segment L3N are not uniquely determined. The first reference line segment L1N is positioned to give the second length L2G the minimum possible value. As a result, the first reference line segment L1N is positioned to give the third length L3G the maximum possible value. In this arrangement, the second length L2G is greater than the third length L3G. The third reference line segment L3N is not uniquely determined. Referring to FIG. 14, the third reference line segment L3N is shown as aligned with the second reference line segment L2N.

The first length L1G of the first reference line segment L1N is greater than the sum of the second length L2G of the second reference line segment L2N and the third length L3G of the third reference line segment L3N (L1G>L2G+L3G; L1G>L2G; and L1G>L3G). The third length L3G of the third reference line segment L3N is smaller than the second length L2G of the second reference line segment L2N (0<L3G<L2G).

The shape of the post structure 19 will now be described. The edge SDR2 of the post structure 19 includes a first portion SDR2*a* projecting in the [110] crystal axis direction and a second portion SDR2*b*. The first portion SDR2*a* and the second portion SDR2*b* are delimited by the crossing line S1D. The second portion SDR2*b* includes a third portion SDR2*c* extending in the [110] crystal axis direction, a fourth portion SDR2*d* extending in the [110] crystal axis direction, and a fifth portion SDR2*e* extending in the [1-10] crystal axis direction. Both ends of the first portion SDR2*a* connect to both ends of the fifth portion SDR2*e* via the third portion SDR2*c* and the fourth portion SDR2*d*, respectively, thereby defining the closed edge SDR2. The first portion SDR2*a* is, for example, a convex curve. This convex curve includes at least one portion with a smaller radius of curvature than an arc DC indicated by a dashed line at individual points on the curve. The third portion SDR2*c*, the fourth portion SDR2*d*, and the fifth portion SDR2*e* are line segments. The shape of the post structure 19 is defined by, for example, a rectangle and a convex curve connecting to both vertices of one of the long sides of the rectangle. The convex curve has, on the convex curve, a radius of curvature greater than or equal to a radius equal to half the length of one of the long sides of the rectangle.

An example of the post structure 19 is shown below:

Radius of arc DC (half distance between seventh point P7 and eighth point P8): 15

Length of third portion SDR2*c* and fourth portion SDR2*d:* 12 μm

Length of fifth portion SDR2*e:* 30 μm

The short sides of the rectangle of the edge SDR2 shown in FIG. 14 are longer than the short sides of the rectangle of the edge SDR2 shown in FIG. 13.

As compared to the shape of the current aperture region 23*a* shown in FIG. 10, the first portion SDR1*a* of the edge SDR1 shown in FIG. 14 is represented by a convex curve projecting in the [110] crystal axis direction, rather than the two oblique sides of an isosceles triangle, and the second portion SDR1*b* is represented by a substantial rectangle. The edge SDR1 has no acute angle.

The shape defined by the edge SDR2 of the post structure 19 and the edge SDR1 of the current aperture region 23*a* has an axis of symmetry SYM extending on the second reference line segment L2N. The axis of symmetry SYM extends through the midpoint of the first width W1 on the second reference line segment L2N. The axis of symmetry SYM also extends through the midpoint of the second width W2 on the third reference line segment L3N.

Specific Example 7

Figure 15:
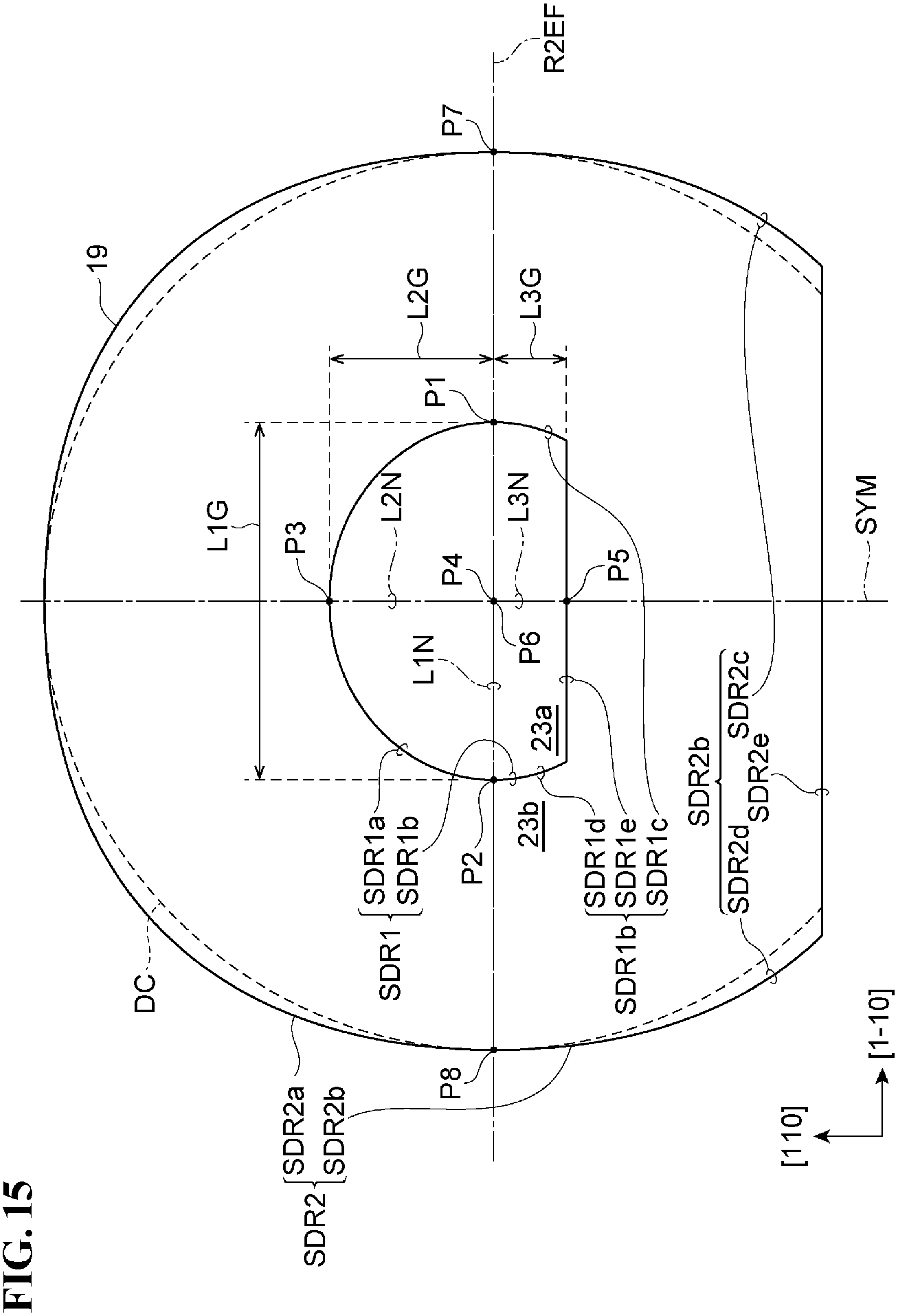
FIG. 15 is a sectional view equivalent to a sectional view taken along line II-II in FIG. 1, showing a specific carrier confinement structure of the vertical cavity surface-emitting laser according to the embodiment.

Referring to FIG. 15, the edge SDR1 of the current aperture region 23*a* and the edge SDR2 of the post structure 19 are shown in solid lines. The cross-section of the current aperture region 23*a* has a projecting shape defined by the edge SDR1.

The first reference plane R1EF crosses a second reference plane R2EF extending in the direction along the first axis Ax1 at a first reference line segment L1N. The first reference line segment L1N joins a first point P1 and a second point P2 on the edge SDR1 of the cross-section defined by the crossing of the first reference plane R1EF and the current aperture region 23*a* (the cross-section shown in FIG. 15). The edge SDR1 has a first portion SDR1*a* and a second portion SDR1*b* that are delimited by the first point P1 and the second point P2.

As shown in FIG. 15, the first reference line segment L1N meets the first condition. The first reference line segment L1N and the second reference line segment L2N meet the second condition. The first reference line segment L1N and the third reference line segment L3N meet the fourth condition.

In this example, the first reference line segment L1N is uniquely determined. The second reference line segment L2N is uniquely determined.

In this example, the third reference line segment L3N is not uniquely determined. Referring to FIG. 15, the third reference line segment L3N is shown as aligned with the second reference line segment L2N.

The first length L1G of the first reference line segment L1N is greater than the sum of the second length L2G of the second reference line segment L2N and the third length L3G of the third reference line segment L3N (L1G>L2G+L3G; L1G>L2G; and L1G>L3G). The third length L3G of the third reference line segment L3N is smaller than the second length L2G of the second reference line segment L2N (0<L3G<L2G).

The shape of the post structure 19 will now be described. The edge SDR2 of the post structure 19 includes a first portion SDR2*a* projecting in the [110] crystal axis direction and a second portion SDR2*b* projecting away from the first portion SDR2*a* in the crystal axis direction. The first portion SDR2*a* and the second portion SDR2*b* are delimited by the crossing line S1D. The second portion SDR2*b* includes a third portion SDR2*c* that is a convex curve, a fourth portion SDR2*d* that is a convex curve, and a fifth portion SDR2*e* extending in the [1-10] crystal axis direction. Both ends of the first portion SDR2*a* connect to both ends of the fifth portion SDR2*e* via the third portion SDR2*c* and the fourth portion SDR2*d*, respectively, thereby defining the closed edge SDR2. The first portion SDR2*a* is, for example, a convex curve. This convex curve includes a portion having an arc shape with a smaller radius of curvature than an arc DC indicated by a dashed line at individual points on the curve. Each of the third portion SDR2*c* and the fourth portion SDR2*d* is, for example, a convex curve. This convex curve includes a portion having an arc shape with a smaller radius of curvature than an arc DC indicated by a dashed line at individual points on the curve. An example of the post structure 19 is shown below:

Radius of arc DC (half distance between seventh point P7 and eighth point P8): 15 μm.

Length of fifth portion SDR2*e:* 16 μm

As compared to the shape of the current aperture region 23*a* shown in FIG. 11, the first portion SDR1*a* of the edge SDR1 shown in FIG. 15 is represented by a convex curve projecting in the [110] crystal axis direction, rather than the two oblique sides of an isosceles triangle. The second portion SDR1*b* is represented by a substantial isosceles trapezoid. Specifically, the shape of the edge SDR1 is defined by, for example, a substantial isosceles trapezoid having a long base and a short base and a convex curve connecting to both vertices of the long base of the isosceles trapezoid. The convex curve has, on the convex curve, a radius of curvature greater than or equal to a radius equal to half the length of the long base of the isosceles trapezoid. The edge SDR1 has no acute angle.

The edge SDR1 shown in FIG. 15 is represented by a convex curve projecting in the [110] crystal axis direction, rather than the two oblique sides of an isosceles triangle, and a line segment connecting both ends of the convex curve.

The shape defined by the edge SDR2 of the post structure 19 and the edge SDR1 of the current aperture region 23*a* has an axis of symmetry SYM extending on the second reference line segment L2N. The axis of symmetry SYM extends through the midpoint of the first width W1 on the second reference line segment L2N. The axis of symmetry SYM also extends through the midpoint of the second width W2 on the third reference line segment L3N.

Specific Example 8

Figure 16:
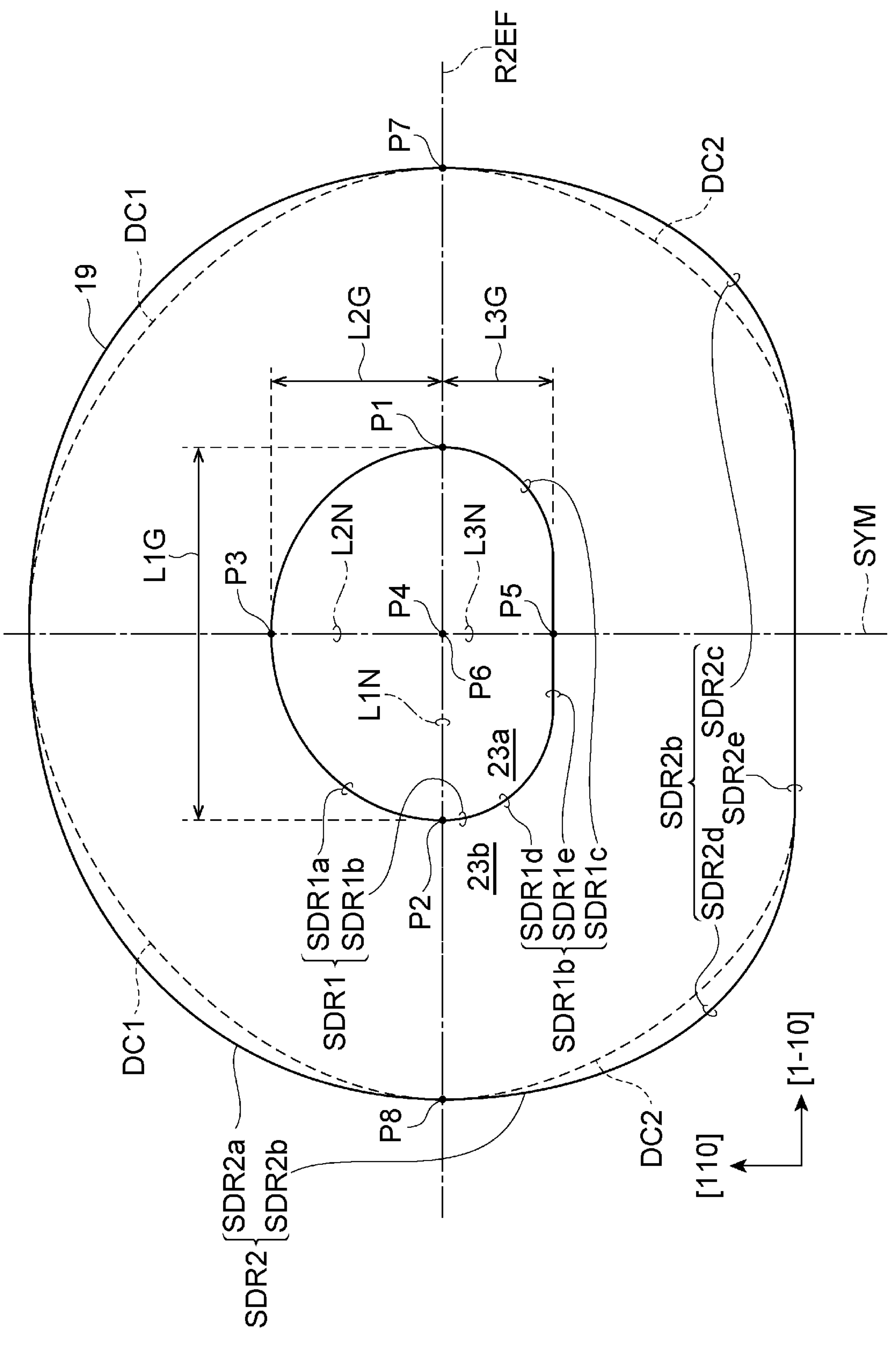
FIG. 16 is a sectional view equivalent to a sectional view taken along line II-II in FIG. 1, showing a specific carrier confinement structure of the vertical cavity surface-emitting laser according to the embodiment.

Referring to FIG. 16, the edge SDR1 of the current aperture region 23*a* and the edge SDR2 of the post structure 19 are shown in solid lines. The cross-section of the current aperture region 23*a* has a projecting shape defined by the edge SDR1.

The first reference plane R1EF crosses a second reference plane R2EF extending in the direction along the first axis Ax1 at a first reference line segment L1N. The first reference line segment L1N joins a first point P1 and a second point P2 on the edge SDR1 of the cross-section defined by the crossing of the first reference plane R1EF and the current aperture region 23*a* (the cross-section shown in FIG. 16). The edge SDR1 has a first portion SDR1*a* and a second portion SDR1*b* that are delimited by the first point P1 and the second point P2.

As shown in FIG. 16, the first reference line segment L1N meets the first condition. The first reference line segment L1N and the second reference line segment L2N meet the second condition. The first reference line segment L1N and the third reference line segment L3N meet the fourth condition.

In this example, the first reference line segment L1N is uniquely determined. The second reference line segment L2N is uniquely determined.

In this example, the third reference line segment L3N is not uniquely determined. Referring to FIG. 16, the third reference line segment L3N is shown as aligned with the second reference line segment L2N.

The first length L1G of the first reference line segment L1N is greater than the sum of the second length L2G of the second reference line segment L2N and the third length L3G of the third reference line segment L3N (L1G>L2G+L3G; L1G>L2G; and L1G>L3G). The third length L3G of the third reference line segment L3N is smaller than the second length L2G of the second reference line segment L2N (0<L3G<L2G).

The shape of the post structure 19 will now be described. The edge SDR2 of the post structure 19 includes a first portion SDR2*a* projecting in the [110] crystal axis direction and a second portion SDR2*b* projecting away from the first portion SDR2*a* in the crystal axis direction. The first portion SDR2*a* and the second portion SDR2*b* are delimited by the crossing line S1D. For example, the first portion SDR2*a* includes a convex curve, and the second portion SDR2*b* has a projecting shape connecting both ends of the convex curve. Specifically, the second portion SDR2*b* includes a third portion SDR2*c* that is a convex curve, a fourth portion SDR2*d* that is a convex curve, and a fifth portion SDR2*e* extending in the [1-10] crystal axis direction. Both ends of the first portion SDR2*a* connect to both ends of the fifth portion SDR2*e* via the third portion SDR2*c* and the fourth portion SDR2*d*, respectively, thereby defining the closed edge SDR2. The first portion SDR2*a* includes, for example, a portion having a smaller radius of curvature than an arc DC1 indicated by a dashed line. The third portion SDR2*c* and the fourth portion SDR2*d* include, for example, a portion having a smaller radius of curvature than an arc DC2 indicated by a dashed line. As indicated by the dashed lines, the arc DC2 has a smaller radius of curvature than the arc DC1. An example of the post structure 19 is shown below:

Radius of arc DC1 (half distance between seventh point P7 and eighth point P8): 15 μm.

Radius of arc DC2 ((distance between seventh point P7 and eighth point P8—length of fifth portion SDR2*e*)/2): 13 μm Length of fifth portion SDR2*e*: 4 μm The shape of the post structure 19 is defined by, for example, a convex curve including a plurality of arcs having a plurality of radii of curvature and smoothly connecting to each other and a line segment connecting both ends of the convex curve.

As compared to the shape of the current aperture region 23*a* shown in FIG. 12, the first portion SDR1*a* of the edge SDR1 shown in FIG. 16 is represented by a convex curve projecting in the [110] crystal axis direction, rather than the two oblique sides of an isosceles triangle. The second portion SDR1*b* is represented by a substantial rectangle. The rectangle of the second portion SDR1*b* has rounded vertices. The edge SDR1 has no acute angle.

The shape defined by the edge SDR2 of the post structure 19 and the edge SDR1 of the current aperture region 23*a* has an axis of symmetry SYM extending on the second reference line segment L2N. The axis of symmetry SYM extends through the midpoint of the first width W1 on the second reference line segment L2N. The axis of symmetry SYM also extends through the midpoint of the second width W2 on the third reference line segment L3N.

Specific Example 9

Figure 17:
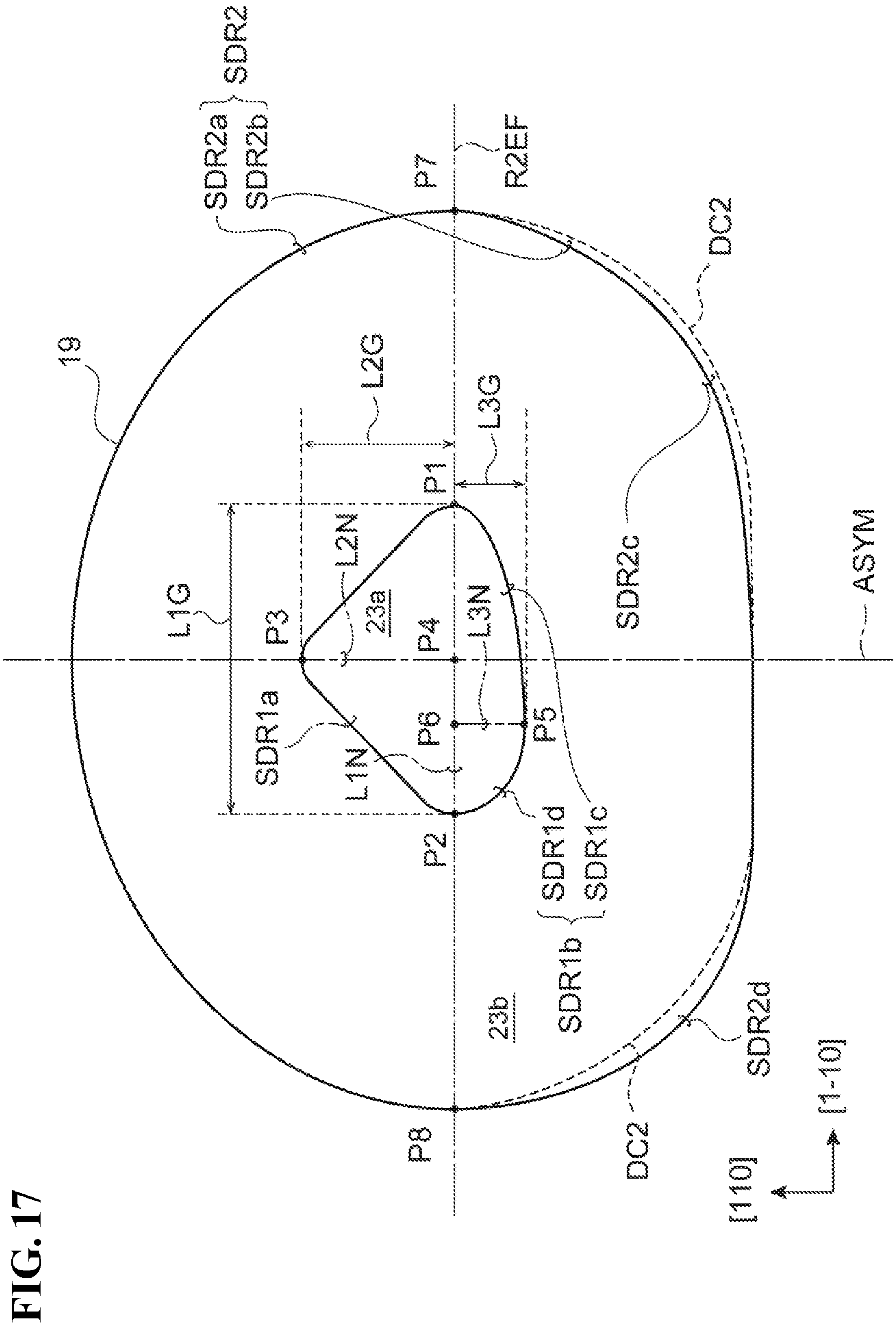
FIG. 17 is a sectional view equivalent to a sectional view taken along line II-II in FIG. 1, showing a specific carrier confinement structure of the vertical cavity surface-emitting laser according to the embodiment.

Referring to FIG. 17, the edge SDR1 of the current aperture region 23*a* and the edge SDR2 of the post structure 19 are shown in solid lines. The cross-section of the current aperture region 23*a* has a projecting shape defined by the edge SDR1.

The first reference plane R1EF crosses a second reference plane R2EF extending in the direction along the first axis Ax1 at a first reference line segment L1N. The first reference line segment L1N joins a first point P1 and a second point P2 on the edge SDR1 of the cross-section defined by the crossing of the first reference plane R1EF and the current aperture region 23*a* (the cross-section shown in FIG. 17). The edge SDR1 has a first portion SDR1*a* and a second portion SDR1*b* that are delimited by the first point P1 and the second point P2.

As shown in FIG. 17, the first reference line segment L1N meets the first condition. The first reference line segment L1N and the second reference line segment L2N meet the second condition. The first reference line segment L1N and the third reference line segment L3N meet the fourth condition.

In this example, the first reference line segment L1N is uniquely determined. The second reference line segment L2N is uniquely determined.

In this example, the third reference line segment L3N is uniquely determined. Referring to FIG. 17, the third reference line segment L3N is shown as not being aligned with the second reference line segment L2N. The edge SDR1 includes a first portion SDR1*a* projecting in the [110] crystal axis direction and a second portion SDR1*b* projecting away from the first portion SDR1*a* in the [110] crystal axis direction. Specifically, the first portion SDR1*a* is defined by a substantial isosceles triangle with rounded acute angles. The second portion SDR1*b* has a curved line having no symmetric axis.

The first length L1G of the first reference line segment L1N is greater than the sum of the second length L2G of the second reference line segment L2N and the third length L3G of the third reference line segment L3N (L1G>L2G+L3G; L1G>L2G; and L1G>L3G). The third length L3G of the third reference line segment L3N is smaller than the second length L2G of the second reference line segment L2N (0<L3G<L2G).

The shape of the post structure 19 will now be described. The edge SDR2 of the post structure 19 includes a first portion SDR2*a* projecting in the [110] crystal axis direction and a second portion SDR2*b* projecting away from the first portion SDR2*a* in the crystal axis direction. The first portion SDR2*a* and the second portion SDR2*b* are delimited by the crossing line S1D. For example, the first portion SDR2*a* includes a convex curve with a large radius of curvature, and the second portion SDR2*b* has a projecting shape connecting both ends of the convex curve. Specifically, the second portion SDR2*b* includes a third portion SDR2*c* that is a convex curve, and a fourth portion SDR2*d* that is a convex curve. Both ends of the first portion SDR2*a* connect to each end of the third portion SDR2*c* and the fourth portion SDR2*d*, respectively, thereby defining the closed edge SDR2. The third portion SDR2*c* includes, for example, a portion having a larger radius of curvature than an arc DC2 indicated by a dashed line. The fourth portion SDR2*d* includes, for example, a portion having a smaller radius of curvature than an arc DC2 indicated by a dashed line. As indicated by the dashed lines, the arc DC2 has a smaller radius of curvature than the arc DC1. An example of the post structure 19 is shown below:

Radius of large arc: 15 μm

Radius of arc DC2: 13 μm

The shape of the post structure 19 is defined by, for example, a convex curve including a plurality of arcs having a plurality of radii of curvature and smoothly connecting to each other and a line segment connecting both ends of the convex curve.

The shape defined by the first portion SDR2*a* of the post structure 19 and the first portion SDR1*a* of the current aperture region 23*a* have an axis of symmetry ASYM extending on the second reference line segment L2N. On the other hand, the shape defined by the second portions SDR2*b* and SDR1*b* have no axis of symmetry. The axis of symmetry ASYM extends through the midpoint of the first width W1 on the second reference line segment L2N. The axis of symmetry ASYM does not extend along the third reference line segment L3N.

Attention will now be directed to the individual specific examples.

For Specific Examples 1 to 8, the first portion SDR1*a* of the edge SDR1 may have a projecting shape projecting in the direction from the fourth point P4 toward the third point P3. The first portion SDR1*a* is a projecting curve projecting in the direction from the fourth point P4 toward the third point P3.

For Specific Examples 3, 4, 7, and 8, the third length L3G of the third reference line segment L3N is greater than zero, and the second width W2 of the second portion SDR1*b* of the edge SDR1 is defined as the length of a line segment parallel to the first reference line segment L1N. The second width W2 changes monotonically from the first length L1G in the direction from the fifth point P5 toward the sixth point P6.

For Specific Examples 2 and 6, the third length L3G of the third reference line segment L3N is greater than zero. The second width W2 of the second portion SDR1*b* is defined as the length of a line segment parallel to the first reference line segment L1N. The second width W2 remains substantially the same as the first length L1G in the direction from the fifth point P5 toward the sixth point P6.

For Specific Examples 1 and 5, the third length L3G of the third reference line segment L3N is zero, and the second portion SDR1*b* is a line segment connecting both ends of the first portion SDR1*a*.

For Specific Examples 3, 4, 7, and 8, the second portion SDR1*b* of the edge SDR1 has a projecting shape including a convex curve and projecting in the direction from the fifth point P5 toward the sixth point P6.

For Specific Examples 4, 7, and 8, the second portion SDR1*b* of the edge SDR1 includes a first projecting curve, a second projecting curve, and a line segment connecting the first and second curves.

For Specific Examples 2 and 6, the second portion SDR1*b* of the edge SDR1 includes first and second line segments extending in the direction from the fifth point P5 toward the sixth point P6 and a third line segment connecting the first and second line segments.

For Specific Examples 3 and 4, the edge SDR1 may include a first projecting curve, a second projecting curve, a third projecting curve, a first line segment connecting the first and second curves, a second line segment connecting the first and third curves, and a third line segment connecting the second and third curves.

For Specific Example 4, the second portion SDR1*b* of the edge SDR1 may include a first projecting curve, a second projecting curve, and a line segment connecting the first and second line segments.

The embodiment is not limited to the foregoing specific examples. For example, at least one of the first portion SDR1*a* and the second portion SDR1*b* of the edge SDR1 may include a first projecting curve, a second projecting curve, and a line segment connecting the first and second line segments.

The shape of the post structure 19 will now be described. The edge SDR2 of the post structure 19 includes a first portion SDR2*a* having a projecting shape projecting in the [110] crystal axis direction and a second portion SDR2*b* having a projecting shape projecting away from the first portion SDR2*a* in the [110] crystal axis direction. The first portion SDR2*a* and the second portion SDR2*b* are joined such that the edge SDR2 forms a projecting shape.

Whereas the principles of the present invention have been illustrated and described with reference to a preferred embodiment, one skilled in the art would appreciate that modifications can be made to the arrangement and details of the invention without departing from the principles thereof. The invention is not limited to any particular configuration disclosed in the embodiment. Thus, all changes and modifications that come within the scope of the claims and the spirit thereof are to be claimed.

As described above, the embodiment provides a vertical cavity surface-emitting laser with reduced relative intensity noise.

What is claimed is:

1. A vertical cavity surface-emitting laser comprising:

a substrate having a main surface comprising a III-V group compound semiconductor; and a post structure including an active layer and a carrier confinement structure that are arranged in a direction along a first axis crossing the main surface of the substrate, wherein the post structure is mounted on the substrate, the carrier confinement structure includes a first region and a second region, the first region having a lower resistivity than the second region, the first region and the second region being arranged in a first reference plane crossing the direction along the first axis, the first region has an edge, a first length, a second length, and a third length, the edge has a first portion and a second portion, and has a shape of an isosceles triangle with a rounded vertex angle and acute base angles, the first length is a length of a first reference line segment, the first reference line segment joining a first point and a second point on the edge, the first reference line segment being a longest one of a first set of line segments joining any two points on the edge and extending in a [1-10] direction of the III-V group compound semiconductor, the second length is a length of a second reference line segment, the second reference line segment joining a point on the first portion of the edge and a point on the first reference line segment, the second reference line segment making a right angle with the first reference line segment, the third length is a length of a third reference line segment, the third reference line segment joining a point on the second portion of the edge and a point on the first reference line segment, the third reference line segment making a right angle with the first reference line segment, the first length is greater than a sum of the second length and the third length, and the third length is smaller than the second length and is zero or more.

2. The vertical cavity surface-emitting laser according to claim 1, wherein the post structure has an edge, and the edge of the post structure has a first portion projecting in a [110] axis direction of the III-V group compound semiconductor and a second portion extending in the [110] axis direction of the III-V group compound semiconductor.

3. The vertical cavity surface-emitting laser according to claim 1, wherein the second reference line segment and the third reference line segment lie on a single straight line, and wherein the single straight line coincides with a single axis of symmetry of the first region of the carrier confinement structure.

4. The vertical cavity surface-emitting laser according to claim 1, wherein the first length is greater than 1.1 times the sum of the second length and the third length.

5. A vertical cavity surface-emitting laser comprising:

a substrate having a main surface comprising a III-V group compound semiconductor; and a post structure including an active layer and a carrier confinement structure that are arranged in a direction along a first axis crossing the main surface of the substrate, wherein the post structure is mounted on the substrate, the carrier confinement structure includes a first region and a second region, the first region having a lower resistivity than the second region, the first region and the second region being arranged in a first reference plane crossing the direction along the first axis, the first region has an edge, a first length, a second length, and a third length, the edge has a first portion and a second portion, and has a shape of a rectangle and an isosceles triangle sharing a base with the rectangle, the isosceles triangle having a rounded vertex angle, the first length is a length of a first reference line segment, the first reference line segment joining a first point and a second point on the edge, the first reference line segment being a longest one of a first set of line segments joining any two points on the edge and extending in a [1-10] direction of the III-V group compound semiconductor, the second length is a length of a second reference line segment, the second reference line segment joining a point on the first portion of the edge and a point on the first reference line segment, the second reference line segment making a right angle with the first reference line segment, the third length is a length of a third reference line segment, the third reference line segment joining a point on the second portion of the edge and a point on the first reference line segment, the third reference line segment making a right angle with the first reference line segment, the first length is greater than a sum of the second length and the third length, and the third length is smaller than the second length and is zero or more.

6. The vertical cavity surface-emitting laser according to claim 5, wherein the post structure has an edge, and the edge of the post structure has a first portion projecting in a [110] axis direction of the III-V group compound semiconductor and a second portion extending in the [110] axis direction of the III-V group compound semiconductor.

7. The vertical cavity surface-emitting laser according to claim 5, wherein the second reference line segment and the third reference line segment lie on a single straight line, and wherein the single straight line coincides with a single axis of symmetry of the first region of the carrier confinement structure.

8. The vertical cavity surface-emitting laser according to claim 5, wherein the first length is greater than 1.1 times the sum of the second length and the third length.

9. A vertical cavity surface-emitting laser comprising:

a substrate having a main surface comprising a III-V group compound semiconductor; and a post structure including an active layer and a carrier confinement structure that are arranged in a direction along a first axis crossing the main surface of the substrate, wherein the post structure is mounted on the substrate, the carrier confinement structure includes a first region and a second region, the first region having a lower resistivity than the second region, the first region and the second region being arranged in a first reference plane crossing the direction along the first axis, the first region has an edge, a first length, a second length, and a third length, the edge has a first portion and a second portion, and has a shape of an isosceles trapezoid and an isosceles triangle sharing a base with the isosceles trapezoid, the isosceles triangle having a rounded vertex angle, the first length is a length of a first reference line segment, the first reference line segment joining a first point and a second point on the edge, the first reference line segment being a longest one of a first set of line segments joining any two points on the edge and extending in a [1-10] direction of the III-V group compound semiconductor, the second length is a length of a second reference line segment, the second reference line segment joining a point on the first portion of the edge and a point on the first reference line segment, the second reference line segment making a right angle with the first reference line segment, the third length is a length of a third reference line segment, the third reference line segment joining a point on the second portion of the edge and a point on the first reference line segment, the third reference line segment making a right angle with the first reference line segment, the first length is greater than a sum of the second length and the third length, and the third length is smaller than the second length and is zero or more.

10. The vertical cavity surface-emitting laser according to claim 9, wherein the post structure has an edge, and the edge of the post structure has a first portion projecting in a [110] axis direction of the III-V group compound semiconductor and a second portion projecting in the [110] axis direction of the III-V group compound semiconductor.

11. The vertical cavity surface-emitting laser according to claim 9, wherein the second reference line segment and the third reference line segment lie on a single straight line, and wherein the single straight line coincides with a single axis of symmetry of the first region of the carrier confinement structure.

12. The vertical cavity surface-emitting laser according to claim 9, wherein the first length is greater than 1.1 times the sum of the second length and the third length.

13. A vertical cavity surface-emitting laser comprising:

a substrate having a main surface comprising a III-V group compound semiconductor; and a post structure including an active layer and a carrier confinement structure that are arranged in a direction along a first axis crossing the main surface of the substrate, wherein the post structure is mounted on the substrate, the carrier confinement structure includes a first region and a second region, the first region having a lower resistivity than the second region, the first region and the second region being arranged in a first reference plane crossing the direction along the first axis, the first region has an edge, a first length, a second length, and a third length, the edge has a first portion and a second portion, and has a shape of an isosceles trapezoid and an isosceles triangle sharing a base with the isosceles trapezoid, the isosceles triangle having a rounded vertex angle, and the isosceles trapezoid having rounded obtuse angles, the first length is a length of a first reference line segment, the first reference line segment joining a first point and a second point on the edge, the first reference line segment being a longest one of a first set of line segments joining any two points on the edge and extending in a [1-10] direction of the III-V group compound semiconductor, the second length is a length of a second reference line segment, the second reference line segment joining a point on the first portion of the edge and a point on the first reference line segment, the second reference line segment making a right angle with the first reference line segment, the third length is a length of a third reference line segment, the third reference line segment joining a point on the second portion of the edge and a point on the first reference line segment, the third reference line segment making a right angle with the first reference line segment, the first length is greater than a sum of the second length and the third length, and the third length is smaller than the second length and is zero or more.

14. The vertical cavity surface-emitting laser according to claim 13, wherein the post structure has an edge, the edge of the post structure has a first portion projecting in a [110] axis direction of the III-V group compound semiconductor and a second portion projecting in the [110] axis direction of the III-V group compound semiconductor, and the second portion of the edge of the post structure has a sector shape.

15. The vertical cavity surface-emitting laser according to claim 13, wherein the second reference line segment and the third reference line segment lie on a single straight line, and wherein the single straight line coincides with a single axis of symmetry of the first region of the carrier confinement structure.

16. The vertical cavity surface-emitting laser according to claim 13, wherein the first length is greater than 1.1 times the sum of the second length and the third length.

17. A vertical cavity surface-emitting laser comprising:

a substrate having a main surface comprising a III-V group compound semiconductor; and a post structure including an active layer and a carrier confinement structure that are arranged in a direction along a first axis crossing the main surface of the substrate, wherein the post structure is mounted on the substrate, the carrier confinement structure includes a first region and a second region, the first region having a lower resistivity than the second region, the first region and the second region being arranged in a first reference plane crossing the direction along the first axis, the first region has an edge, a first length, a second length, and a third length, the edge has a first portion and a second portion, and has a shape of a convex curve and a line segment connecting endpoints of the convex curve, the first length is a length of a first reference line segment, the first reference line segment joining a first point and a second point on the edge, the first reference line segment being a longest one of a first set of line segments joining any two points on the edge and extending in a [1-10] direction of the III-V group compound semiconductor, the second length is a length of a second reference line segment, the second reference line segment joining a point on the first portion of the edge and a point on the first reference line segment, the second reference line segment making a right angle with the first reference line segment, the third length is a length of a third reference line segment, the third reference line segment joining a point on the second portion of the edge and a point on the first reference line segment, the third reference line segment making a right angle with the first reference line segment, the first length is greater than a sum of the second length and the third length, and the third length is smaller than the second length and is zero or more.

18. The vertical cavity surface-emitting laser according to claim 17, wherein the second reference line segment and the third reference line segment lie on a single straight line, and wherein the single straight line coincides with a single axis of symmetry of the first region of the carrier confinement structure.

19. The vertical cavity surface-emitting laser according to claim 17, wherein the first length is greater than 1.1 times the sum of the second length and the third length.

20. A vertical cavity surface-emitting laser comprising:

a substrate having a main surface comprising a III-V group compound semiconductor; and a post structure including an active layer and a carrier confinement structure that are arranged in a direction along a first axis crossing the main surface of the substrate, wherein the post structure is mounted on the substrate, the carrier confinement structure includes a first region and a second region, the first region having a lower resistivity than the second region, the first region and the second region being arranged in a first reference plane crossing the direction along the first axis, the first region has an edge, a first length, a second length, and a third length, the edge has a first portion and a second portion, and has a shape of a convex curve and a rectangle adjoining with the convex curve, the first length is a length of a first reference line segment, the first reference line segment joining a first point and a second point on the edge, the first reference line segment being a longest one of a first set of line segments joining any two points on the edge and extending in a [1-10] direction of the III-V group compound semiconductor, the second length is a length of a second reference line segment, the second reference line segment joining a point on the first portion of the edge and a point on the first reference line segment, the second reference line segment making a right angle with the first reference line segment, the third length is a length of a third reference line segment, the third reference line segment joining a point on the second portion of the edge and a point on the first reference line segment, the third reference line segment making a right angle with the first reference line segment, the first length is greater than a sum of the second length and the third length, and the third length is smaller than the second length and is zero or more.

21. The vertical cavity surface-emitting laser according to claim 20, wherein the second reference line segment and the third reference line segment lie on a single straight line, and wherein the single straight line coincides with a single axis of symmetry of the first region of the carrier confinement structure.

22. The vertical cavity surface-emitting laser according to claim 20, wherein the first length is greater than 1.1 times the sum of the second length and the third length.

* * * * *